United States Patent
Fischer et al.

(10) Patent No.: US 7,744,991 B2
(45) Date of Patent: *Jun. 29, 2010

(54) THERMALLY CONDUCTING FOAM INTERFACE MATERIALS

(75) Inventors: Patrick J. Fischer, St. Paul, MN (US); James J. Kobe, Newport, MN (US); Cameron T. Murray, Lake Elmo, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 63 days.

This patent is subject to a terminal disclaimer.

(21) Appl. No.: 10/449,679

(22) Filed: May 30, 2003

(65) Prior Publication Data

US 2004/0241417 A1 Dec. 2, 2004

(51) Int. Cl.
*B32B 5/22* (2006.01)
*B32B 7/12* (2006.01)

(52) U.S. Cl. .............. 428/317.9; 428/317.3; 428/318.4; 428/319.3; 428/319.7; 428/355 AC; 428/343

(58) Field of Classification Search ............. 428/317.9, 428/317.3, 318.4, 355 AC, 343
See application file for complete search history.

(56) References Cited

U.S. PATENT DOCUMENTS

| RE24,906 | E |   | 12/1960 | Ulrich |   |
|---|---|---|---|---|---|
| 4,059,714 | A |   | 11/1977 | Scholl et al. |   |
| 4,361,663 | A | * | 11/1982 | Agarwal et al. | 524/62 |
| 5,232,970 | A |   | 8/1993 | Solc et al. |   |
| 5,550,175 | A | * | 8/1996 | Bredahl et al. | 523/348 |
| 5,738,936 | A | * | 4/1998 | Hanrahan | 428/313.5 |
| 5,753,362 | A | * | 5/1998 | Kawase et al. | 428/327 |
| 5,904,796 | A | * | 5/1999 | Freuler et al. | 156/278 |
| 6,207,272 | B1 | * | 3/2001 | Takahira et al. | 428/355 AC |
| 6,432,497 | B2 | * | 8/2002 | Bunyan | 428/40.1 |
| 6,866,928 | B2 | * | 3/2005 | Narum et al. | 428/354 |
| 7,063,887 | B2 | * | 6/2006 | Kobe et al. | 428/317.9 |
| 2001/0055678 | A1 | * | 12/2001 | Murata et al. |   |
| 2002/0128336 | A1 |   | 9/2002 | Kolb et al. |   |
| 2002/0187294 | A1 |   | 12/2002 | Zhou et al. |   |

FOREIGN PATENT DOCUMENTS

| CN | 1245521 A | 2/2000 |
|---|---|---|
| DE | 198 51 166 A1 | 5/2000 |

(Continued)

OTHER PUBLICATIONS

US 20040241410, copending U.S. Appl. No. 10/449,156, filed May 30, 2003, Fischer et al, "Thermal Interface Materials and Method of Making Thermal Interface Materials," Dec. 2, 2004.*

(Continued)

*Primary Examiner*—Hai Vo
(74) *Attorney, Agent, or Firm*—James A. Baker

(57) ABSTRACT

In one aspect, the invention provides a foam thermal interface material comprising a foamed film, the film comprising a blend of polymeric hot melt pressure sensitive adhesive having a number average molecular weight of greater than 25,000 and at least 25 percent by weight of thermally conductive filler, said film having a void volume of at least 5 percent of the volume of said foamed film.

18 Claims, 3 Drawing Sheets

FOREIGN PATENT DOCUMENTS

| | | |
|---|---|---|
| EP | 0 566 093 A1 | 10/1993 |
| EP | 0 878 527 A1 | 11/1998 |
| JP | 2002-128931 | 5/2002 |
| JP | 2003-49144 | 2/2003 |
| WO | WO 95/25774 | 9/1995 |
| WO | WO 99/05722 | 2/1999 |
| WO | WO 01/57152 A2 | 8/2001 |
| WO | WO 01/76855 A1 | 10/2001 |
| WO | WO 02/20687 A2 | 3/2002 |
| WO | WO 03/066766 A1 | 8/2003 |
| WO | WO 2004/056932 A1 | 7/2004 |
| WO | WO 2004/061036 A1 | 7/2004 |

OTHER PUBLICATIONS

"Viscoelastic Properties of Pressure Sensitive Adhesives", Handbook of Pressure Sensitive Adhesive Technology, Second Edition, Edited by Donatas Satas, 1989, pp. 172, 173, 174, 175, 202, 203.

Introduction to Physical Polymer Science, Chapter 1, p. 6, L. H. Sperling ISBN 0-471-89092-8, 1986.

U.S. Appl. No. 10/449,156, filed May 30, 2003, Thermal Interface Materials and Method of Making Thermal Interface Materials.

Technical Bulletin, EXOLIT® IFR-23, Clariant Corporation.

* cited by examiner

THERMALLY CONDUCTING FOAM INTERFACE MATERIALS

BACKGROUND

Integrated circuits, active and passive components, optical disk drives, and the like generate heat under use conditions that must be diffused to allow continuous use of the heat generating component. Heat sinks in the form of finned metal blocks and heat spreaders containing heat pipes are commonly attached to these heat generating components to allow excess heat to be conducted away and radiated into the atmosphere. Materials useful for providing a thermal bridge between the heat generating components and heat sinks/heat spreaders are known. Many of these materials are based on gel masses, liquid to solid phase change compounds, greases, or pads that must be mechanically clamped between a printed circuit board (PCB) and heat sink.

More recently, thermally conductive materials incorporating adhesives have been introduced. These thermally conductive adhesive materials typically form an adhesive bond between the heat generating component and heat sink/heat spreader so that no mechanical clamping is required. Both heat-activated (hot melt) and pressure sensitive adhesives have been used in thermally conductive adhesives. In all cases, these thermal interface materials need to be thermally enhanced (compared with unfilled or lightly filled polymer compositions), be dimensionally stable at elevated temperatures (heat generating components often run at 50° C. or higher), and be soft and conformable enough to provide good contact (wet-out) between the substrates. Typically, such thermally conductive adhesives have compromised thermal conductivity for softness/conformability or vice versa.

Articles incorporating a polymer foam core are characterized by the density of the foamed polymer being lower than the density of the pre-foamed polymeric matrix. The lowered density for the foam may be achieved in several known ways such as by foaming with chemical blowing agents or by interspersing microspheres within the matrix, the microspheres typically being made of glass or of certain polymeric materials, the former being detrimental to the softness/conformability of the foam.

Foams have been used to join two rigid substrates, or substrates with uneven or rough surfaces. However, heretofore, foams have not been used for thermal interface materials. It was believed that discontinuous voids in the thermal interface material should be avoided due to the insulating nature of such voids. Thus thermal conductivity was compromised.

In certain applications, a fire retardant feature may be needed and/or may be required by applicable regulations. For example, tapes to be used in electric or electronic applications may be directly exposed to electrical current, to short circuits, and/or to heat generated from the use of the associated electronic component or electrical device. Consequently, industry standards or regulations may impose conditions on the use of such tape articles that require qualifying tests be performed such as burn tests, and the like. For electrical and electronics applications, the industry standard flammability test is Underwriters Laboratories (UL 94 "Standard for Tests for Flammability of Plastic Materials for Parts in Devices and Appliances").

In other applications, there is a need for rework/and or repair, such as for example, attaching an aluminum frame to a plasma display panel (PDP). In these applications, an easily removable attachment system such as a stretch-releasable attachment system would be beneficial.

Consequently, it is desirable to provide thermally conductive foams and thermally conductive adhesive interfaces that have acceptable thermal conductivity and are soft/conformable and methods for the manufacture of the thermal interface materials. It is also desirable to provide the foregoing thermally conductive articles in a fire retardant construction which optionally has stretch releasable properties.

SUMMARY

In one aspect, the invention provides a foam thermal interface material comprising a foamed film, the film comprising a blend of polymeric hot melt pressure sensitive adhesive having a number average molecular weight of greater than 25,000 and at least 25 percent by weight of thermally conductive filler, said film having a void volume of at least 5 percent of the volume of said foamed film.

In another aspect, the invention provides a thermal interface composition comprising polymeric hot melt pressure sensitive adhesive having a number average molecular weight of greater than 25,000, at least 25 percent by weight of thermally conductive filler, and an effective amount of a foaming agent.

In other aspects, the foam thermal interface materials and compositions of the invention may further comprise fire retardant and/or microfiber forming material.

In another aspect, the invention provides a method for preparing a foam thermal interface material, comprising:
  (a) melt mixing a pressure sensitive adhesive (PSA) polymer, thermally conductive particles, and a foaming agent to form an expandable formable composition;
  (b) activating the foaming agent;
  (c) forming the formable composition into a foamed film having an outer surface; and
  (d) optionally applying a thermally conductive adhesive composition onto the outer surface of the foamed film.

In still another aspect of the invention, the foaming agent can be activated after extruding the extrudable composition.

Other features and advantages of the invention will be apparent to those practicing in the art upon consideration of the Detailed Description, and from the appended claims.

BRIEF DESCRIPTION OF THE FIGURES

In describing the various features of the preferred embodiment, reference is made to the various figures, in which like reference numerals indicate like features and wherein.

DETAILED DESCRIPTION

Figure 1:
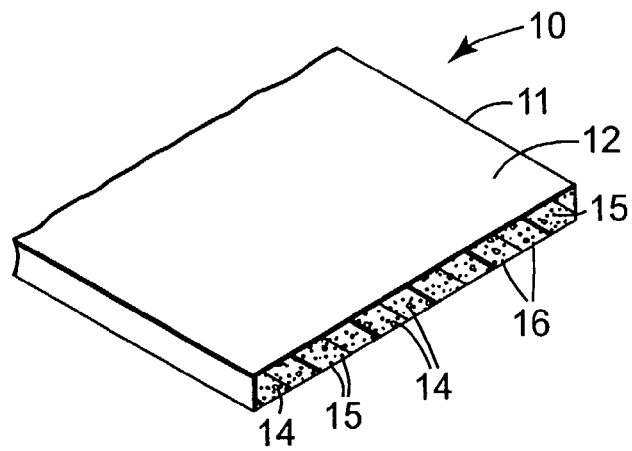
FIG. 1 is a perspective drawing showing a thermal interface material of the invention.

Certain terms are used herein in describing the preferred embodiment of the invention. All such terms are intended to be interpreted in a manner consistent with their usage by those skilled in the art. For convenience, by way of example and not limitation, the following meanings are set forth:

"Void volume" refers to the voids that there are present in the adhesive that are formed by activating a foaming agent contained in the adhesive.

"Fire retardant" refers to a substance that when applied to or incorporated within a combustible material, reduces or eliminates the tendency of the material to ignite and/or reduces the tendency to continue burning once ignited, when exposed to heat or flame.

"Stretch release" refers to the property of an adhesive article characterized in that, when the article is pulled and elongated from a substrate surface at a rate of 30 centimeters/minute and at an angle of 45° or less, the article detaches from a substrate surface without leaving a significant amount of visible residue on the substrate or when the article has been used between two rigid substrates, the article is pulled and elongated at a rate of 30 centimeters/minute and at an angle of 5° or less, the article detaches from a substrate surface without leaving a significant amount of visible residue on at least one of the rigid substrates.

"Substantially continuous" refers to a microfiber that is unbroken for at least about 0.5 cm in the machine direction.

"Substantially free" refers to a component that is present in a thermal interface material (TIM) of the invention at levels of less than 0.1, 0.09, or 0.08 percent by weight, based on the weight of the polymeric hot melt PSA.

The invention provides foam thermal interface materials (foam TIMs) comprising a thermally conductive filler and a hot melt pressure sensitive adhesive (PSA) polymer foam (or foamed film) that is desirably substantially free or free of oligomers or low molecular weight polymers, other than residuals resulting from polymerization of the PSA, (that is, <25,000 number average molecular weight), N-tert-butylacrylamide, organic solvent, added free radical initiators, and crosslinking agents. The foamed film may also comprise one or more polymer microspheres capable of further expansion when heated. The outer surface of the foamed film may be substantially smooth or it may be patterned, and the foamed film may be provided in any of a variety of configurations including sheets, rods, or cylinders. At least a portion of the outer surface may serve as a substrate for films, adhesive layers, and the like, thus providing any of a variety of tape/TIMs. The foamed film of the TIMs of the invention contain at least about 5 percent void volume as determined by the test method described herein.

The desired characteristics of a foam TIM according to the invention include one or more of the following: (1) bulk thermal conductivity of at least about 0.5 Watts/meter-K; (2) Shore A hardness less than about 60; (3) static shear strength at 22° C. or 70° C. of at least about 10,000 minutes when tested according to the test methods described below; and (4) when the TIM comprises viscoelastic microfibers, the tensile break strength of at least about 150% of the yield strength of the TIM with an elongation greater than about 200%, and less than about 50% recovery after being elongated 100%, and when the TIM comprises elastic microfibers, the TIM has an elongation greater than about 200% and have greater than about 50% recovery after being elongated 100%. Foam TIMs comprising the continuous adhesive film and/or the optional skin adhesive layer(s) applied to the surfaces of the foam PSA film can have a high adhesion when applied to a panel, such as 90 degree peel adhesion of greater than about 0.0438 kN/m (4 oz/in), in other embodiments, greater than about 0.176 kN/m, or greater than about 0.352 kN/m.

The polymeric hot melt PSA useful in the invention has a number average molecular weight of greater than 25,000, particularly, a number average molecular weight of greater than 100,000, and more particularly a number average molecular weight of greater than 200,000, and even more particularly a number average molecular weight of greater than 400,000 (as defined in Introduction to Physical Polymer Science, Chapter 1, page 6, L. H. Sperling ISBN 0-471-89092-8). The polymeric hot melt PSA may be selected from any of a variety of polymeric materials, such as rubbers, elastomers, thermoplastic polyurethanes, thermoplastic elastomers, poly-alpha-olefins, synthetic rubbers, acrylate polymers and methacrylate polymers, acrylate and methacrylate copolymers, and combinations of the foregoing. The optional thermally conductive adhesive layer may be a PSA, such as, for example, poly-alpha-olefin adhesive, acrylic acid adhesive, a rubber based adhesive, a silicone adhesive, a blend of rubber based adhesive and acrylic adhesive, and combinations thereof. Likewise, the optional thermally conductive adhesive layer may be a heat-activated adhesive. The continuous foamed film and/or the optional thermally conductive adhesive layer may be provided with substantially continuous, individual polymeric microfibers therein and oriented in the machine direction, the microfibers imparting stretch release properties to the article. In addition, the continuous film and/or optional thermally conductive adhesive layer may comprise a fire retardant.

One example of a foam TIM according to the invention is shown in FIG. 1. The foam TIM 10 comprises a foamed film 11 having a first flat surface 12 and a second surface (not shown) opposite the first surface 12. According to the invention, at least one thermally conductive filler 15 is interspersed throughout a polymeric adhesive matrix 16. The foamed film 11 comprises a polymer adhesive matrix 16 with a plurality of voids 14 interspersed within the matrix. The voids 14 are the result of the foaming process used in the manufacture of the film 11 and may be created through the use, for example, of blowing agents or by the inclusion of expandable polymeric microspheres or combinations thereof. If expandable microspheres are included in the manufacture of the foamed film 11, the voids 14 typically comprise the polymer microspheres in an expanded and unbroken form and provide a void volume of at least 5%.

It will be appreciated that other layers and/or structures may be applied or affixed to the first surface 12 of the foamed film 11. In associating other layers or structures with the surface 12, a layer of a thermally conductive skin adhesive may first be applied to the first surface 12 to bond the additional layers or structures to the surface 12. Likewise, the foamed film 11 may be provided as a two-sided tape TIM having another adhesive layer, in particular a thermally conductive adhesive layer, on surface opposite the first surface 12. A release liner or the like may be associated with the thermally conductive skin adhesive(s) on either or both of the surfaces of the foamed film 11.

Figure 2:
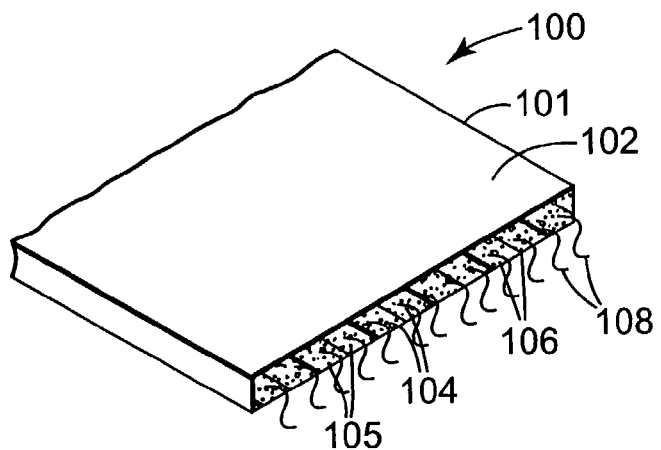
FIG. 2 is a perspective drawing showing a second thermal interface material.

FIG. 2 shows foam TIM 100 in the form of a foamed film 101 having a first surface 102 and a second surface opposite the first surface (not shown). According to this embodiment of the invention, foam TIM 100 comprises a foamed film 101 comprising at least one thermally conductive filler 105, a plurality of voids 104, and individual, substantially continuous viscoelastic and/or elastic microfibers 108 interspersed throughout polymeric adhesive matrix 106 and oriented in the machine direction. Microfibers 108 are typically formed in situ during the manufacture of the TIM and are oriented in the machine direction. It will be appreciated that other layers and/or structures may be applied or affixed to the surfaces 102 of the foamed film 101.

The polymeric hot melt PSAs (prior to compounding with thermally conductive filler) useful in the invention have a number average molecular weight of greater than 25,000 and is tacky at room temperature (about 22° C.). PSAs are a distinct category of adhesives which in dry (solvent-free) form are permanently tacky at room temperature. They firmly adhere to a variety of dissimilar surfaces upon mere contact without the need of more than finger or hand pressure. PSAs require no activation by water, solvent, or heat to exert a relatively strong adhesive holding force. PSAs can be quantitatively described using the "Dahlquist criteria" which maintains that the elastic modulus of these materials is less than $10^6$ dynes/cm$^2$ at room temperature. See Pocius, A. V., Adhesion & Adhesives: An Introduction, Hanser Publishers, New York, N.Y., First Edition, 1997. The foams of the invention may comprise one or more PSAs. It may be desirable to use two or more PSA polymers having different compositions to achieve unique foam properties. A wide range of foam physical properties can be obtained by selectively choosing the PSA component types and concentrations. A particular polymer may be selected based upon the desired properties of a final material.

The hot melt PSA may be any of a variety of different polymer materials including elastomers, rubbers, thermoplastic elastomers, poly-alpha-olefin adhesives, acrylic adhesives, and blends thereof. Typically, the polymer resins are of the type that are suitable for melt extrusion processing, as described in U.S. Pat. No. 6,103,152, incorporated in its entirety herein by reference thereto. It may be desirable to blend two or more polymers having chemically different compositions. The physical properties of the foam can be optimized by varying the types of components used in creating the foam and by varying their relative concentrations. A particular hot melt PSA is generally chosen or selected based upon the desired properties of the final thermal interface material. It is recognized that the polymer material used to prepare the hot melt PSA may contain residual amounts of free radical initiatiors, oligomers or low molecular weight polymers (<25,000 number average molecular weight), or organic solvent.

Suitable materials for producing a useful hot melt PSA include acrylate and methacrylate polymers or co-polymers. Such polymers can be formed by polymerizing 50 to 100 parts by weight of one or more monomeric acrylic or methacrylic esters of non-tertiary alkyl alcohols, with the alkyl groups having from 1 to 20 carbon atoms (e.g., from 3 to 18 carbon atoms). Suitable acrylate monomers include methyl acrylate, ethyl acrylate, n-butyl acrylate, lauryl acrylate, 2-ethylhexyl acrylate, cyclohexyl acrylate, iso-octyl acrylate, octadecyl acrylate, nonyl acrylate, decyl acrylate, isobornyl acrylate, and dodecyl acrylate. Also useful are aromatic acrylates, e.g., benzyl acrylate and cyclobenzyl acrylate. In some applications, it may be desirable to use less than 50 parts by weight of the monomeric acrylic or methacrylic esters. Optionally, one or more monoethylenically unsaturated co-monomers may be polymerized with the acrylate monomers in amounts from about 0 to 50 parts co-monomer. One class of useful co-monomers includes those having a homopolymer glass transition temperature greater than the glass transition temperature of the acrylate homopolymer. Examples of suitable co-monomers falling within this class include acrylic acid, acrylamide, methacrylamide, substituted acrylamides, such as N,N-dimethyl acrylamide, itaconic acid, methacrylic acid, acrylonitrile, methacrylonitrile, vinyl acetate, N-vinyl pyrrolidone, isobornyl acrylate, cyano ethyl acrylate, N-vinylcaprolactam, maleic anhydride, hydroxyalkylacrylates, N,N-dimethyl aminoethyl (meth)acrylate, N,N-diethylacrylamide, beta-carboxyethyl acrylate, vinyl esters of neodecanoic, neononanoic, neopentanoic, 2-ethylhexanoic, or propionic acids (e.g., available from Union Carbide Corp. of Danbury, Conn., under the designation VYNATES), vinylidene chloride, styrene, vinyl toluene, and alkyl vinyl ethers.

A second class of useful co-monomers includes those having a homopolymer glass transition temperature less than the glass transition temperature of the acrylate homopolymer. Examples of suitable co-monomers falling within this class include ethoxyethoxy ethyl acrylate (Tg=−71° C.) and methoxypolyethylene glycol 400 acrylate (Tg=−65° C., available from Shin Nakamura Chemical Co., Ltd., under the designation NK Ester AM-90G).

Another group of polymers useful in the present invention includes pressure sensitive and hot melt adhesives prepared from non-photopolymerizable monomers. Such polymers can be adhesive polymers (i.e., polymers that are inherently adhesive), or polymers that are not inherently adhesive but are capable of forming adhesive compositions when compounded with tackifiers. Specific examples include polyurethanes, poly-alpha-olefins (e.g., polyoctene, polyhexene, and atactic polypropylene), block copolymer-based adhesives, natural and synthetic rubbers, silicone adhesives, ethylene-vinyl acetate, and epoxy-containing structural adhesive blends (e.g., epoxy-acrylate and epoxy-polyester blends), and combinations thereof.

In some instances, it may be desirable that the adhesive has a high service temperature (i.e., up to or greater than 70° C.). This can be accomplished in several known methods. For example, acrylic based adhesives can be crosslinked by irradiation by electron beam (E-beam), gamma, and the like. Block copolymer-based adhesives can have their elevated temperature performance improved through the addition of polyphenylene oxide (PPO) or an end block reinforcing resin to the block copolymer as described in U.S. Pat. No. 6,277,488, which is incorporated herein by reference.

A number of thermally conductive fillers are suitable for use in the adhesives of the invention. The thermally conductive filler is selected from a variety of materials having a bulk conductivity of between about 5 and 1000 Watts/meter-K as measured according to ASTM D1530. Examples of suitable thermally conductive fillers include but are not limited to, aluminum oxide, beryllia, zirconia, aluminum titanate, silicon carbide, boron carbide, silicon nitride, aluminum hydroxide, magnesium hydroxide, titanium dioxide, aluminum nitride, boron nitride, titanium nitride, and the like, and combinations thereof. These fillers are found in a variety of shapes/forms (spherical, flakes, agglomerates, crystals, acicular, fumed). The choice of shape is dependent upon the rheology of the selected adhesive resin and ease of processing of the final hot melt PSA/particle mix. Fillers may be available in several crystal types (e.g., hexagonal and rhombic boron nitride) and the type of crystal chosen will depend upon the thermal conductivity of the crystal (including the anisotropic nature of the conductivity along different crystal axes), effect of crystal type on final mechanical properties and cost.

Particle size and distribution will also affect mechanical and adhesive properties, so particle size selection should accommodate the final adhesive property requirements. In other embodiments, the particle size of the filler (or mixture of fillers) and particle loading are selected to produce suitable thermal conductance while retaining adequate mechanical properties.

Typically, useful thermally conductive particles have an average particle size in the range of from about 0.5 micrometers (μm) to about 250 micrometers. In other embodiments, the thermally conductive particles may range in average size from about 1 to about 100 micrometers and from about 10 to about 70 micrometers. The particles may range in average size in any range between 0.5 and 250 micrometers and may be any average size between 0.5 and 250 micrometers. The adhesive may contain thermally conductive particles that can bridge the adhesive and/or thermal interface matrix and be exposed through the matrix to a degree increasing with their size. Thus, particles are contained within the PSA and improve thermal conductivity in the path between the heat-source substrate and heat-conducting article, such as a heat sink article. These particles are of sufficient size to impinge near or against base of heat sink article such that they impress into or onto its surface prior to or after the heat sink article is placed in service. Generally, increasing the size of these particles to the same adhesive thickness will increase the thermal conductivity between a heat-source substrate and the heat-conducting article.

The choice of particle size depends on the application. For example, particles having a major dimension of at least about 1-2 µm and about 30 µm or below and in other embodiments, between about 5 and 20 µm, are suitable when the bond line will be in the 25 to 100 µm range (such as found between a central processing unit (CPU) and a heat sink). Particles larger than about 20 to 30 µm, such as 50 to 250 µm, are used where a larger gap exists between the hot and cold substrates. In addition, combinations of different particle size materials can be used. Larger conductive filler particle size results in higher bulk conductivity. When at least some of the selected particles are capable of being plastically deformed during heat sink article attachment, these particle sizes can be even larger than the sizes mentioned above. A mixture of particle sizes can result in improved packing density which improves the resultant conductivity. Combinations of different thermally conductive fillers have been shown to provide equivalent thermal performance at reduced costs by substituting a portion of an expensive filler (for example, boron nitride) with a less expensive filler (for example, silicon carbide). Thermally conductive fillers often have anisotropic thermal conductivity along various crystal planes, so filler orientation via known methods can be used to enhance thermal performance.

The thermally conductive particles may be present in the adhesive compositions of the invention in an amount of at least 25 percent by weight of the total composition. In other embodiments of the invention, the thermally conductive filler is present in an amount of at least about 30 weight percent, at least about 40 weight percent, and in some embodiments of the invention, at least about 50 weight percent. In other embodiments, thermally conductive fillers may be present in the adhesive blends of the invention in a range of from 25 to 80 weight percent, 30 to 80 weight percent, 40 to 80 weight percent, 50 to 80 weight percent, or any range between 25 and 80 weight percent.

While the maximum of thermally conductive filler is selected based on the final properties (e.g., hardness, conformability, adhesion, and thermal conductivity) of the article, the thermally conductive filler is generally present is an amount less than about 80 weight percent.

The foam thermal interface material has a bulk conductivity of at least about 0.5 Watts/meter-K; in other embodiments, the foam thermal interface material has a bulk conductivity of at least about 0.6 Watts/meter-K; and in other embodiments, at least about 0.8 Watts/meter-K.

Useful foaming agents include entrained gases/high pressure injectable gases; blowing agents, such as chemical blowing agents and physical blowing agents; expanded or unexpanded polymeric bubbles; and combinations thereof.

High pressure injectable gases are gases that are added to sealed mixing systems (e.g., a sealed extruder) at a pressure of greater than 20.67 MPa (3000 psi) to generate a foam upon existing the sealed system. Examples of high pressure injectable gases include nitrogen, air, carbon dioxide ($CO_2$), and other compatible gases, and combinations thereof.

A physical blowing agent useful in the present invention is any naturally occurring atmospheric material which is a vapor at the temperature and pressure at which the foamed film exits the die. The physical blowing agent may be introduced into the polymeric material as a gas, liquid, or supercritical fluid. The physical blowing agent may be injected into the extruder system. A physical blowing agent is usually in a supercritical state at the conditions existing in the extruder during the process. If a physical blowing agent is used, it is preferable that it is soluble in the polymeric material being used. The physical blowing agents used will depend on the properties sought in the resulting foam articles. Other factors considered in choosing a blowing agent are its toxicity, vapor pressure profile, and ease of handling. Blowing agents, such as pentane, butane, and other organic materials, such as hydrofluorocarbons (HFC) and hydrochlorofluorocarbons (HCFC) may be used, but non-flammable, non-toxic, non-ozone depleting blowing agents are preferred because they are easier to use, e.g., fewer environmental and safety concerns. Suitable physical blowing agents include, for example, carbon dioxide, nitrogen, SF6, nitrous oxide, perfluorinated fluids, such as $C_2F_6$, argon, helium, noble gases, such as xenon, air (nitrogen and oxygen blend), and blends of these materials, hydrofluorocarbons (HFC), hydrochlorofluorocarbons (HCFC), and hydrofluoroethers (HFE).

Chemical blowing agents do not require an injection system as does a physical blowing agent and they can be used in virtually any extrusion system. Examples of chemical blowing agents include water and azo-, carbonate-, and hydrazide-based molecules including, e.g., 4,4'-oxybis(benzenesulfonyl)hydrazide, such as CELOGEN OT (available from Uniroyal Chemical Company, Inc., Middlebury, Conn.), 4,4'-oxybenzenesulfonyl semicarbazide, p-toluenesulfonyl semicarbazide, p-toluenesulfonyl hydrazide, oxalic acid hydrazide, diphenyloxide-4,4'-disulphohydrazide, benzene-sulfonhydrazide, azodicarbonamide, azodicarbonamide (1,1'-azobisformamide), meta-modified azodicarbonides, 5-phenyltetrazole, 5-phenyltetrazole analogues, hydrazocarboxylates, diisopropylhydrazodicarboxylate, barium azodicarboxylate, 5-phenyl-3,6-dihydro-1,3,4-oxadiazin-2-one, sodium borohydride, azodiisobutyronitrile, trihydrazinotriazine, metal salts of azodicarboxylic acids, tetrazole compounds, sodium bicarbonate, ammonium bicarbonate, preparations of carbonate compounds and polycarbonic acids, and mixtures of citric acid and sodium bicarbonate, N,N'-dimethyl-N,N'-dinitroso-terephthalamide, N,N'-dinitrosopentamethylenetetramine, and combinations thereof. It has been found that silicon carbide available from Washington Mills Electro Minerals Corp., Niagara Falls, N.Y., under the trade designation of SILCARIDE G-21 Silicon Carbide Grade P240, functions as a chemical blowing agent as well as a thermally conductive filler. Additional chemical blowing agents are described in Klempner, D., Frisch, K. C. (editors), Handbook of Polymeric Foams and Foam Technology, Chapter 17, (Hansen, N.Y., 1991).

One or more expandable polymeric microsphere can be used as the foaming agent in the foamed thermally conductive film of the invention. An expandable polymeric microsphere comprises a polymer shell and a core material in the form of a gas, liquid, or combination thereof. Upon heating to a temperature at or below the melt or flow temperature of the polymeric shell, the polymer shell will expand. Examples of suitable core materials include propane, butane, pentane, isobutane, neopentane, or similar material, and combinations thereof. The identity of the thermoplastic resin used for the polymer microsphere shell can influence the mechanical properties of the foam, and the properties of the foam may be adjusted by the choice of microsphere, or by using mixtures of different types of microspheres. For example, acrylonitrile-containing resins are useful where high tensile and cohesive strength are desired in a low density foam article. This is especially true where the acrylonitrile content is at least 50 weight percent of the resin used in the polymer shell, generally at least 60 weight percent, and typically at least 70 weight percent. Examples of suitable thermoplastic resins which may be used as the shell include acrylic and methacrylic acid esters, such as polyacrylate; acrylate-acrylonitrile copolymer; and methacrylate-acrylic acid copolymer. Vinylidene chloride-containing polymers, such as vinylidene chloride-methacrylate copolymer, vinylidene chloride-acrylonitrile copolymer, acrylonitrile-vinylidene chloride-methacrylonitrile-methyl acrylate copolymer, and acrylonitrile-vinylidene chloride-methacrylonitrile-methyl methacrylate copolymer may also be used, but may not be desired if high strength is sought. In general, where high strength is desired, the microsphere shell will have no more than 20 weight percent vinylidene chloride and typically no more than 15 weight percent vinylidene chloride. High strength applications may require microspheres with essentially no vinylidene chloride. Halogen free microspheres may also be used in the foams of the invention. Examples of suitable commercially available expandable polymeric microspheres include those available from Pierce Stevens (Buffalo, N.Y.) under the designations F-30D, F-50D, F-80SD, and F-100D. Also suitable are expandable polymeric microspheres available from Expancel, Inc. (Duluth, Ga.) under the designations EXPANCEL 551, EXPANCEL 461, EXPANCEL 091, and EXPANCEL 092 MB 120. The selection of expandable polymeric microsphere is typically based on its expansion temperature and on the thermally conductive filler used.

The amount of foaming agent is selected to provide a void volume constituting at least 5% of the volume of the foamed film. In general, the higher the foaming agent concentration, the lower the density of the foamed film and the lower the thermal conductivity. That is, the higher the void volume, the lower the thermal conductivity of the foamed film. For example, the amount of microspheres in the polymer resin typically ranges from about 0.1 parts by weight to about 10 parts by weight (based upon 100 parts of polymer), in other embodiments, from about 0.5 parts by weight to about 5 parts by weight, and in other embodiments, from about 0.5 parts by weight to about 2 parts by weight.

The foam TIM contains at least about 5 percent void volume as determined by the test method described herein. In another embodiment, the foam TIM contains at least about 10 percent void volume as determined by the test method described herein. Generally, the foam TIM contains less than about 75 percent void volume, less than about 60 percent, or less than about 50 percent void volume due to influence of voids on thermally conductivity.

In certain applications, a fire retardant feature may be needed and/or may be required by applicable regulations. For example, tapes to be used in electric or electronic applications may be directly exposed to electrical current, to short circuits, and/or to heat generated from the use of the associated electronic component or electrical device. Consequently, industry standards or regulations may impose conditions on the use of such tape articles that require qualifying tests be performed, such as burn tests, and the like. For electrical and electronics applications, the industry standard flammability test is Underwriters Laboratories (UL 94 "Standard for Tests for Flammability of Plastic Materials for Parts in Devices and Appliances"). It is preferable that the foam TIM will pass UL 94 V-2 flammability rating and in other embodiments, will pass a UL 94 V-0 flammability rating.

Fire retardants suitable for inclusion in the foam TIMs of the present invention include any type of fire retardant which are generally present in the film at a concentration of between about 5 weight percent and about 40 weight percent based on the total weight of the foam TIM. The fire retardants can be intumescent fire retardants and/or non-intumescent fire retardants. Typically, the fire retardants are non-halogen containing and antimony-free. Examples of suitable fire retardants for use in the foam TIMs described herein include those commercially available from Clariant Corporation of Charlotte, N.C., under the designation EXOLIT, including those designated IFR 23, AP 750, EXOLIT OP grade materials based on organophosphorous compounds, and EXOLIT RP grades of red phosphorus materials non-halogenated fire retardants, such as FIREBRAKE ZB and BORGARD ZB, and FR 370 (tris(tribromoneopentyl) phosphate), available from Dead Sea Bromine Group, Beer Shiva, Israel. Examples of suitable fire retardants that also function as thermally conductive fillers include aluminum hydroxide and magnesium hydroxide.

Blends of one or more fire retardants and/or a synergist may also be used in the foam TIMs of the invention. Selection of the fire retardant system will be determined by various parameters, for example, the industry standard for the desired application, and by composition of the foamed film polymer matrix. In addition, the foam TIMs of the invention may contain smoke suppressants, such as those available under the trade designation Kemgard HPSS, 911A, 911B, and 911C, available from Sherwin-Williams Chemicals, Cleveland, Ohio.

To provide stretch release properties and to further reinforce the foam TIMs of the invention, the thermally conductive film, the thermally conductive skin adhesive or both the film and the skin adhesive will include microfiber forming materials that form viscoelastic and/or elastic microfibers formed in situ during the manufacturing process described herein. The individual microfibers are individual substantially continuous and dispersed throughout the adhesive polymer matrix and oriented in the machine direction of the film. It has been found that suitable microfibers include those formulated according to the teachings of pending U.S. Patent. Publication No. 02-0187294-A1, incorporated in its entirety herein by reference thereto. In foam TIMs of the invention, the individual microfibers are unbroken for at least about 0.5 centimeters (cm) in the machine direction, in other embodiments, at least about 2 cm, about 5 cm, or about 8 cm. In another aspect, the individuals substantially continuous microfibers generally have a maximum diameter of about 0.05 to about 5 micrometers, typically from about 0.1 to about 1 micrometer and the aspect ratio (i.e., the ratio of the length to the diameter) of the individual substantially continuous microfibers is greater than about 1000.

The foam TIM may also include a number of other additives other than materials expressly excluded above. Examples of suitable additives include tackifiers (e.g., rosin esters, terpenes, phenols, and aliphatic, aromatic, or mixtures of aliphatic and aromatic synthetic hydrocarbon resins), pigments, reinforcing agents, hydrophobic or hydrophilic silica, calcium carbonate, toughening agents, fibers, fillers, antioxidants, stabilizers, and combinations thereof. The foregoing additional agents and components are generally added in amounts sufficient to obtain an article having the desired end properties, in particular, adhesive properties. For good conformability and surface contact, it is preferred that the TIM has a hardness less than about 60 Shore A.

Other embodiments of the invention include tapes and transfer tapes. Useful backing materials are thermally conductive. Such backing materials can be inherently thermally conductive or may contain additive(s), such as those described under "Thermally Conductive Fillers" above, to impart thermal conductivity. Examples of suitable backing materials include cellulosic materials, such as paper and cloth (woven and nonwoven); films, such as polyester, polyvinyl chloride, polyurethane, polypropylene, and nylon; thermally conductive foam materials, such as polyethylene foams and acrylic foams; scrims; and metal foils, such as aluminum foil. In another embodiment, the backing material can be a release liner. In this embodiment, the backing does not need to be thermally conductive. The release liner can be coated on one or both sides with a release coating. The backing may also be provided as multiple layers.

Multilayer foam TIMs can also be prepared by laminating polymer or nonpolymer layers to a foamed film, or by layering extruded foamed films as they exit their respective shaping orifices, with the use of some affixing means, such as an adhesive. Other techniques that can be used include extrusion coating and inclusion coextrusion, which is described in, for example, U.S. Pat. No. 5,429,856, incorporated herein by reference.

Figure 3:
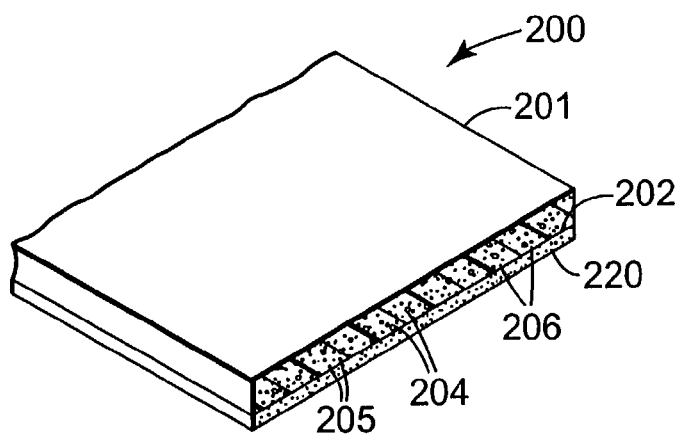
FIG. 3 is a perspective drawing of a thermal interface material featuring a continuous film combined with a thermally conductive adhesive layer.

FIG. 3 depicts yet another TIM 200 in which a thermally conductive skin adhesive layer 220 is provided on one of the surfaces 202 of the foamed film 201. Foamed film 201 comprises a polymer adhesive matrix 206 with a plurality of voids 204 and thermally conductive particles 205 interspersed within the matrix. The skin adhesive layer 220 may comprise any of a variety of adhesive materials and thermally conductive fillers as are further described herein. Typically, the skin adhesive layer 220 is a thermally conductive PSA formulated without fire retardant materials therein. A release liner (not shown) may optionally be included to protect the adhesive layer 220 prior to the application of the adhesive 220 to another substrate or the like.

In accordance with the principals of the invention, the aforementioned thermally conductive skin adhesive layer may be associated with the foamed film by, for example, co-extruding the extrudable foaming agent containing composition with one or more extrudable adhesive compositions, as described in greater detail, below. The thermally conductive adhesive compositions are generally formulated and/or selected without fire retardant to provide an adhesive article, such as a tape wherein the continuous foamed film forms the substrate for the tape. The adhesive may be applied to a portion of the surface of the continuous foamed film (e.g., on one of the major surfaces thereof), leaving a portion of the surface (a second major surface) of the foamed film as a substrate to support additional layers or structures. The skin adhesive can also be laminated to a surface of the foamed film, or the foamed film can be directly extruded or coated onto the skin adhesive layer after the skin adhesive layer has been applied to a release liner. The skin adhesive layer may employ multiple adhesive layers. Typically, the skin adhesive layer has a lower concentration of thermally conductive filler than the foamed film so that adhesion can be maximized. In general, as the amount of thermally conductive filler increases, adhesive properties decrease.

Figure 4:
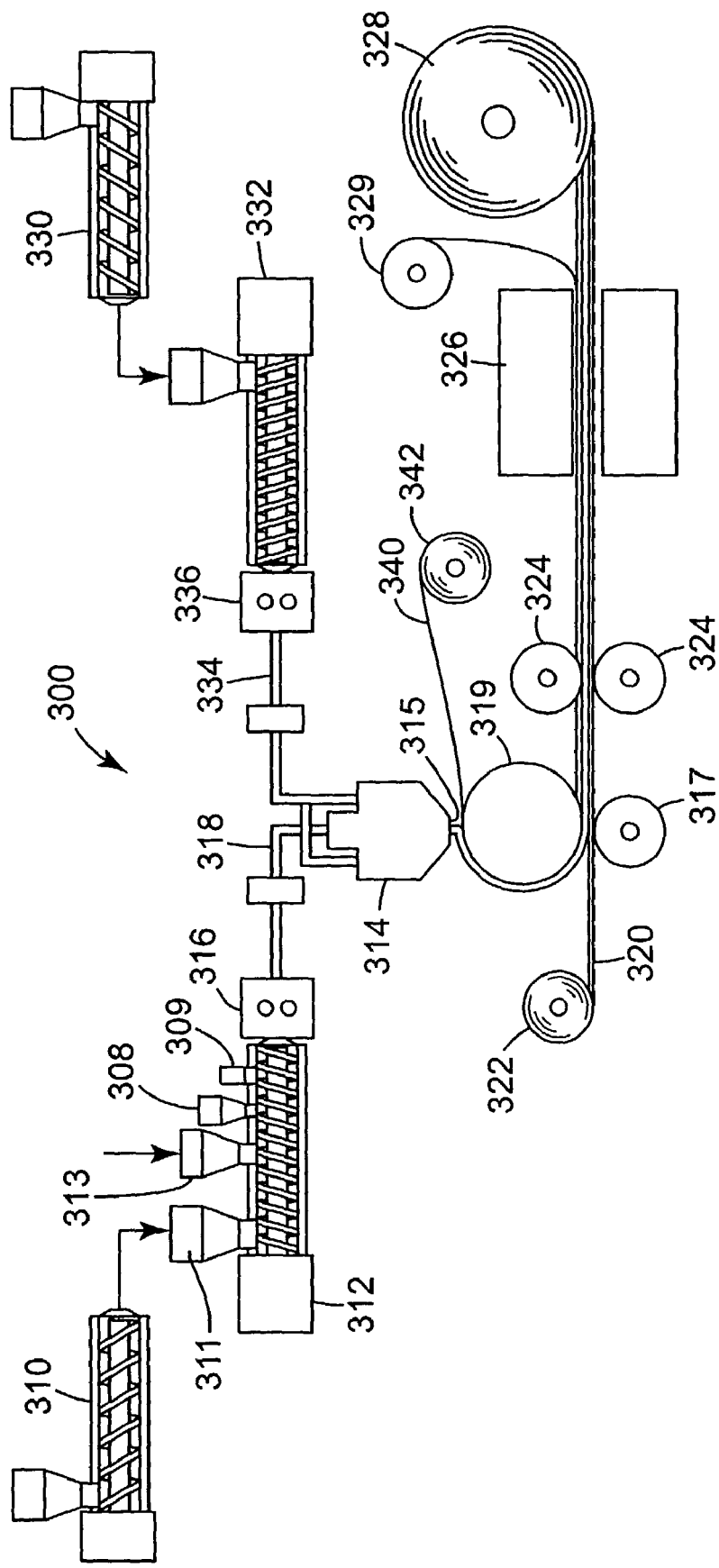
FIG. 4 is a schematic drawing of an extrusion processor for preparing articles according to the invention.

Referring to FIG. 4, an extrusion process 300 is shown for preparing a foam TIM according to the invention. According to the process of the invention, hot melt PSA polymer is fed into a first extruder 310 (typically a single screw extruder) to soften and mix the polymer into a form suitable for extrusion. The resulting polymer will be used to form the polymer matrix of the foamed film. The polymer may be added to the extruder 310 in any convenient form, such as pellets, billets, packages, strands, pouches, and ropes.

Next, the thermally conductive filler, and when present, tackifying resin, fire retardant, microfiber forming material, and other additives (except the expandable microspheres if present) are fed to a second extruder 312 (e.g., typically a twin screw extruder). The hot melt PSA polymer may be fed directly from the extruder 310 into second extruder 312 through the first port 311. The thermally conductive filler and other additives can be fed into any port and are typically fed into the second extruder 312 at entrance 313 which is typically at a point prior to the mixing/dispersing section of the extruder 312. Once combined, the hot melt PSA polymer and additives are well mixed in extruder 312. The order of component addition and mixing conditions (e.g., screw speed, screw length, and temperature) are selected to achieve optimum mixing. Generally, mixing is carried out at a temperature below the threshold temperature required to expand the microspheres, when such microspheres are present. However, temperatures higher than the microsphere expansion temperature may be used, in which case the temperature is typically decreased following mixing and prior to the addition of the microspheres to the extruder 312. It will be appreciated that if the hot melt PSA polymer is provided in a form suitable for extrusion, the first extrusion step may be omitted and the polymer added directly to extruder 312. When incorporating high amounts of thermally conductive filler, it is desirable that the filler is added to the extruder through multiple addition ports (i.e., split feed, not shown) and that vacuum via port 309 be used to remove entrapped air. Generally, void volume may be caused by entrapped gases, chemical blowing agents, physical blowing agents, and microspheres.

The expandable polymeric microspheres may be added to the second extruder 312, typically in a separate zone at downstream entrance 313 typically immediately prior to a conveying zone of extruder 312. Once added, the thermally conductive filler, expandable polymeric microspheres, the hot melt PSA polymer, and the optional fire retardant and/or microfiber forming material are melt-mixed in the conveying zone to form an expandable extrudable composition. The purpose of the melt-mixing step is to prepare an expandable extrudable composition in which the thermally conductive filler, microspheres and other additives, if present, are distributed throughout the molten polymer. Typically, the melt-mixing operation uses one conveying block downstream from entrance 313 to obtain adequate mixing, although kneading elements may be used as well. The temperature, pressure, shear rate, and mixing time employed during melt-mixing are selected to prepare an expandable extrudable composition without causing the microspheres to expand or break. Specific order of addition, zone temperatures, pressures, shear rates, and mixing times are selected based upon the particular chemical compositions being processed, and the selection of these conditions is within the skill of those practicing in the field.

Following melt-mixing, the expandable extrudable composition is metered into extrusion die 314 (e.g., a contact or drop die) through transfer tubing 318 using a gear pump 316. The temperature within multi-layer die 314 is maintained at substantially the same temperature as the temperature within transfer tubing 318. The temperature within die 314 is at or above the temperature required to cause expansion of the expandable microspheres. While extrusion die 314 is shown in FIG. 4 as a multi-layer die, it is understood that die 314 can be a single layer die. While the temperature within the transfer tubing 318 will also be at or above the threshold temperature required to initiate microsphere expansion, the pressure within the transfer tubing 318 is usually high enough to prevent the microspheres from expanding during the time they reside within the tubing 318. The volume within the die 314 is greater than the volume within the tubing 318 so that material flowing from the tubing 318 into the die 314 experiences a pressure drop to a pressure below that within transfer tubing 318. When the expandable extrudable composition enters the die 314, the drop in pressure and the heat within the die 314 will cause the polymeric microspheres to begin expanding. As the microspheres begin to expand, the expandable extrudable composition forms a foam. Most of the microsphere expansion will normally occur before the microspheres exit the die 314. The pressure within the die 314 will continue to decrease as the expandable extrudable composition approaches the exit port 315 of the die 314. The continued decrease of pressure contributes to the further expansion of the microspheres within the die. The flow rate of polymer through the extruder 312 and the die 314 are maintained to keep the pressure in the die cavity sufficiently low to promote the expansion of the expandable microspheres before the expandable polymer composition exits the die 314. The shape of die 314 may be chosen or fashioned to provide a desired shape for the foam TIM. Any of a variety of foam shapes may be produced, including continuous or discontinuous sheets or films. Those skilled in the art will appreciate that chemical blowing agents and the like are also useful in the manufacture of foams according to the invention, either in place of the expandable microspheres or in combination with the microspheres.

If desired, the smoothness of one or both of the foamed film surfaces can be increased by using nip roll 317 to press the foamed film against a chill roll 319 after the foamed film exits die 314, or by using smooth liners on each of the foamed film surfaces and passing the composite article through a nip. Smoothness of the surface(s) is beneficial for good surface contact and adhesion. It is also possible to emboss a pattern on one or both surfaces of the foamed film by contacting the foam with a patterned roll after it exits die 314 or by using a patterned or microstructured liner, such as those described in, for example, U.S. Pat. No. 6,197,397 B1.

For good thermal conductivity, especially when bonding rigid substrates having large attachment areas, it is desirable that there is no air entrapment between the foam TIM and the substrate. Non-contact or non-bonded areas do not conduct heat and reduce the overall thermal conductivity of the foam TIM. Patterned foam TIMs facilitate egress of air and result in improved adhesive contact. The improved softness and conformability of a foam TIM versus a non-foam TIM, also contributes to improved adhesive contact.

The extrusion process can also be used to prepare patterned foamed films having areas of different densities. For example, downstream of the point at which the film exits the die 314 (FIG. 4), the film can be selectively heated, e.g., using a patterned roll or infrared mask, to cause differential or regional expansion of microspheres within designated areas of the foamed film.

In applications requiring improved adhesive properties, the thermally conductive foamed film is combined with one or more skin adhesive layers; in other embodiments, one or more thermally conductive skin adhesive layers, applied to the outer surfaces of the foamed film. The thickness of the skin adhesive layer is typically from about 0.025 mm (1 mil) to about 0.125 mm (5 mils); and in other embodiments, from about 0.025 mm (1 mil) to about 0.076 mm (3 mils). FIG. 4 shows such a co-extrusion process. Adhesive for the skin adhesive layer is introduced to the system by adding an adhesive polymer to the extruder 330 (e.g., a single screw extruder) where the polymer is softened before it is fed to a second extruder 332 (e.g., typically a twin screw extruder) where the polymer is mixed with thermally conductive filler and other additives, if any. The adhesive, typically a PSA, is processed through the system to provide a resulting foam TIM having a skin layer that will be useful as a tape, for example. For such applications, the thermally conductive adhesive is formulated without adding other additives that diminish the adhesive properties or the tackiness of the adhesive.

Although fire retardant materials are normally excluded from the formulation for the adhesive, small amounts of fire retardant may also be included within the adhesive at concentrations that are effective to impart fire retardant properties to the adhesive, while not significantly diminishing the tack of the adhesive. Specifically, it may be desirable to add a small amount of fire retardant to the skin adhesive in very thin (i.e., <0.635 mm (<0.025 inches)) thermally conductive fire retardant foam TIMS. The amount of fire retardant added to the skin adhesive layer is no greater than about 30 weight percent of the total weight of skin adhesive, no greater than about 20 weight percent, no greater than about 10 weight percent, or no greater than about 5 weight percent.

A formable or extrudable adhesive composition is metered from the extruder 332 to the appropriate chambers of die 314 through transfer tubing 334 using a gear pump 336. The adhesive is co-extruded with the foam through an exit port 315 on the die 314 so that the adhesive is applied directly to the outer surface of the foamed film. Where the foamed film is provided in a sheet form having two major outer surfaces thereon, the adhesive may be applied to the foamed film on either or both of the major outer surfaces. Co-extrusion methods for coating an article with adhesive are known to those in the art and need not be further explained here. Other methods can be used for applying the skin adhesive layer, such as for example, direct coating, spray coating, pattern coating, laminating, and the like.

If a skin adhesive layer is applied to both of the major outer foamed film surfaces, the resulting foam TIM is a three-layer article featuring a foamed film core with a skin adhesive layer on each of the major surfaces of the foamed film. For a three layer A/B/C construction (adhesive A/foam B/adhesive C), another extruder and related equipment can be employed to permit another thermally conductive skin adhesive to be applied to the other major surface of the foam. In this construction, the major surfaces of the foam TIM may be adhered to any of a variety of surfaces for use in applications where the thermally conductive properties of the foam TIM are desired and/or required. Moreover, the absence of fire retardant in the skin adhesive layer allows the thermally conductive foamed film to be adhered to a surface or substrate with the maximum degree of adhesion provided by the particular skin adhesive used.

Suitable skin adhesives for use in the articles of the present invention include any adhesive that provides acceptable adhesion to a variety of polar and/or non-polar substrates. PSAs are generally acceptable. Suitable PSAs include those based on acrylic polymers, polyurethanes, thermoplastic elastomers, such as those commercially available under the trade designation KRATON (e.g., styrene-isoprene-styrene, styrene-butadiene-styrene, and combinations thereof) and other block copolymers, polyolefins, such as poly-alpha-olefins and amorphous polyolefins, silicones, rubber based adhesives (including natural rubber, polyisoprene, polyisobutylene, butyl rubber, etc.) as well as combinations or blends of these adhesives. The thermally conductive skin adhesive may contain tackifiers, reinforcing resins, plasticizers, rheology modifiers, fillers, fibers, crosslinkers, antioxidants, dyes, colorants, as well as active components, such as an antimicrobial agent.

A group of PSAs known to be useful in the present invention are, for example, the acrylate copolymers described in, for example, U.S. Pat. No. RE 24,906, incorporated herein by reference, and particularly a copolymer comprising a weight ratio of from about 90:10 to about 98:2 iso-octyl acrylate: acrylic acid copolymer. Also acceptable is a copolymer comprising a weight ratio of about 90:10 to about 98:2 2-ethylhexyl acrylate: acrylic acid copolymer, and a 65:35 2-ethylhexyl acrylate:isobornyl acrylate copolymer. Useful adhesives are described in, for example, U.S. Pat. Nos. 5,804,610 and 5,932,298, both of which are incorporated herein in their entireties by reference thereto. The inclusion of antimicrobial agents in the adhesive is also contemplated, such as is described in, for example, U.S. Pat. Nos. 4,310,509 and 4,323,557, both of which are incorporated in their entireties herein by reference thereto. Blends of acrylic adhesives and rubber based adhesives may also be used such as is described in WO 01/57152, which is incorporated in its entirety herein by reference thereto.

A release liner 320 may be applied to the thermally conductive skin adhesive layer or layers disposed on either or both of the major surfaces of the foam. The liner 320 can be dispensed from a feed roll 322. Suitable materials for liner 320 include silicone release liners, release coated polyester films (e.g., polyethylene terephthalate films), and polyolefin films (e.g., polyethylene films). The liner and the foam are then laminated together between nip rollers 324.

Optional release liner 340 can be added to the opposing surface of the foam by positioning optional second feed roll 342 near one of the nip rolls 324. The second release liner 340 may be the same as or different from the release liner 320. Moreover, the second release liner 340 may be provided with a layer of a thermally conductive adhesive coated or applied to one surface of the release liner 340. In this manner, a second thermally conductive adhesive layer (not shown) may be applied to the second major surface of the foam material. The second thermally conductive skin adhesive layer may be the same as or different from the aforementioned co-extruded adhesive. Typically, the thermally conductive skin adhesive layers will comprise thermally conductive PSAs. Release liners 320, 340 may also be provided with a layer of a thermally conductive adhesive coated or applied to one of its surfaces.

Variations to the foregoing process and to the equipment used will be known to those skilled in the art, and the invention is not limited by the described apparatus of FIG. 4 herein.

Other methods for the manufacture of multilayered foam TIMs are to be considered within the scope of the invention. For example, the foregoing co-extrusion process can be conducted so that a one or two-layer TIM is produced, or to produce TIMs having three or more layers (e.g., 10-100 layers or more) by equipping a single layer die with an appropriate feed block, or by using a multi-vaned or a multi-manifold die. Multilayered TIMs can also be prepared by laminating additional layers (e.g., polymer layers, metals, metal foils, scrims, paper, cloth, adhesives coated on a release liner, etc.) to the foamed film, or to any of the co-extruded polymer layers after the article exits die 314. Other techniques which can be used include pattern coating. The thermally conductive foam film(s) in the TIMs of the invention can be thick, i.e., greater than or equal to 0.25 mm (0.010 inches) or thin (i.e., <0.025 mm (0.010 inches).

Following lamination, the foam TIM is optionally exposed to radiation from an E-beam source 326 to crosslink the foam TIM for improved cohesive strength. Other sources of radiation (e.g., ion beam and gamma radiation) may be used as long as the radiation is energetic enough to penetrate the thickness of the foam TIM to initiate and to sufficiently crosslink the foam TIM throughout its thickness. Following E-beam exposure, the optional second release liner 340 can be rolled up onto a take-up roll 329, and the laminate is rolled up onto a take-up roll 328. For foam TIMs, it may be necessary to E-beam irradiate the foamed film through both major surfaces to sufficiently penetrate the material to induce more complete crosslinking. Alternatively, the TIM could be gamma irradiated after being wound into a roll.

The release liners are typically coated with release agents, such as fluorochemicals or silicones. For example, U.S. Pat. No. 4,472,480 describes low surface energy perfluorochemical liners. Suitable release liners include papers, polyolefin film is, or polyester films coated with silicone release materials. Polyolefin films may not require release coatings when used with acrylic based PSAs. Examples of commercially available silicone coated release liners are POLYSLIK™ silicone release papers (available from James River Co., H. P. Smith Division, Bedford Park, Ill.) and silicone release papers supplied by DCP-Lohja (Dixon, Ill.) now known as Loparex, Inc. (Willowbrook, Ill.). A particular release liner that is known by the designation 1-60BKG-157, a super calendared Kraft paper with a water-based silicone release surface, is available from DCP-Lohja. Other types of E-beam stable, contaminant free release liners are also useful in the invention, such as those described in pending, for example, U.S. Patent Publication No. 02-0155243-A1, assigned to the assignee of this application, and incorporated in its entirety herein by reference.

The foam TIMs of the invention may be used in a variety of applications, including aerospace, automotive, electronic, and medical applications. The foam TIMs of the invention are typically used to join processors and components to heat dissipating devices (for example, heat sinks and spreaders). The properties of the TIMs may be tailored to meet the demands of the desired applications. Specific examples of applications include adhesive tapes, pads, or sheets, vibration damping articles, tape backings, gaskets, spacers, and sealants.

The features of the embodiments of the invention are further illustrated in the following non-limiting examples.

EXAMPLES

In the test methods and examples below, the sample dimensions (typically the length) are approximate except for the width wherein the width was measured to the accuracy of the cutting tool.

These examples are merely for illustrative purposes only and are not meant to be limiting on the scope of the appended claims. All parts, percentages, ratios, etc. in the examples and the rest of the specification are by weight unless indicated otherwise.

Test Methods

Density and Determination of Void Volume

Density was determined according to ASTM D 792-86 "Standard Test Method for Density and Specific Gravity (Relative Density) of Plastics by Displacement." Samples were cut into approximately 2.54 cm×2.54 cm (1 inch (in)×1 inch (in)) specimens and weighed on a high precision balance available as Model AG245 from Mettler-Toledo, Greifensee, Switzerland. The volume of each sample was obtained by measuring the mass of water displaced at room temperature (23° C.+/−1° C.). The buoyancy of each sample was measured in grams (g) using a special attachment for the balance. The density ($D_{meas.}$) of the sample was taken to be its mass divided by its buoyancy, assuming the density of water at 23° C. to be 1 g/cc.

The theoretical density ($D_{theor.}$) of the composition (before foaming) was determined from the following:

$$D_{theor.} \text{ of composition} = (\text{weight percent adhesive component} \times$$
$$D_{meas.} \text{ of adhesive component}) +$$
$$(\text{weight percent first filler component} \times$$
$$D_{theor.} \text{ of first filler component}) +$$
$$(\text{weight percent second filler component} \times$$
$$D_{theor.} \text{ of second filler component}) +$$
$$(\text{weight percent third filler component} \times$$
$$D_{theor.} \text{ of third filler component}),$$

etc.

And from this, the Void Volume was calculated as:

$$\% \text{ Void Volume} = \left(1 - \frac{D_{meas.} \text{ of composition}}{D_{theor.} \text{ of composition}}\right) \times 100$$

The reported % Void Volume includes the void volume contribution of expanded polymeric microspheres and/or entrapped gas and/or chemical blowing agents and/or physical blowing agents.

Hardness Test

The thickness of an article (about 3.81 cm (1.5 in) by 2.54 cm (1.0 in)) sample was measured and recorded. The sample was then laminated to a clean, dry glass panel taking care to avoid trapping air bubbles between the sample and the glass. Additional pieces of article sample were laminated to the first article in the same manner until a total thickness of at least 0.34 cm (0.135 in) was achieved. Using a Shore A Hardness Tester (Model CV Stand and Durometer Type A ASTM D2240 Gauge, available from Shore Instrument Mfg. Co. Inc., Freeport, N.Y.), the initial hardness reading from the instrument was taken at three locations on each sample piece and those values were averaged.

Viscosity

The changes in viscosity were measured using Rheometrics RDA II, available from Rheometrics. The adhesive was put in 25 mm diameter parallel plates with the thickness of 1 mm. The data was plotted as complex viscosity versus temperature and shear rate at 180° C. The viscosity at a frequency of 1 radian/second was reported.

Static Shear Strength Test

A 2.54 cm (1 in) wide by about 3.81 cm (1.5 in) long sample was cut from the article to be tested and pressed onto a solvent-washed (one wash of acetone followed by three washes of heptane), dry, 0.508 cm (2 in) wide by 7.62 cm (3 in) long, Type 304 stainless steel substrate panel and the sample was centered on one end of the panel. An about 10.16 cm (4 in) long by about 3.175 cm (1.25 in) wide by 0.0025 cm (0.001 in) thick sheet of primed polyester film was adhered to the sample by rolling down the primed side of the polyester film onto the sample using a 2 kg (4.5 lb) hard rubber roller, with two passes in each direction, taking care not to trap air bubbles between the film and the sample, with approximately 5.1 cm (2 in) of the polyester film extended off the panel to serve as a tab. The laminate on the panel was then cut to a 2.54 cm (1 in) length so that the resultant bonded area was 2.54 cm×2.54 cm (1 in×1 in). The 5.1 cm (2 in) tab was then folded around a triangular clip, wrapped with masking tape, and stapled so that a weight could be attached to the test specimen. A 1000 g weight was used to test samples at room temperature and a 500 g weight was used to test samples at 70° C. (158° F.). The sample thus prepared was allowed to dwell at room temperature and approximately 50% relative humidity for approximately 24 to 72 hours. The test specimen was then placed in a Static Shear standard fixture having a 2 degree angle back slant. The fixtured specimen was then either tested at room temperature (about 22° C.) or in a forced air oven set at 70° C.±3° C. (158° F.). The elevated temperature test specimen was then given a 10 minute warm up period before attaching the 500 g weight. The test was run until the test specimen failed or 10,000 minutes elapsed. Failure time was recorded.

Tensile Break Strength and Elongation Test (Method I)

Tensile and elongation was determined according to ASTM D412-98a "Standard Test Methods for Vulcanized Rubber and Thermoplastic Elastomers-Tension." A silicone release liner was applied to the exposed surface of the article which already had a liner on one side. A sample was cut using Die E in the machine direction from the article to be tested to form the test specimen. Sample thickness was measured in the center of each specimen using an AMES gauge having a force of 0.1 kg (3.5 oz) and a 0.0635 cm (0.25 in) diameter foot. The tensile tester was set up with the following conditions:

Jaw Gap: 8.89 cm (3.5 in)
Crosshead Speed: 51 cm/min (20 in/min)
Load cell: 45 kg (100 lb)

The initial gauge length was set at 8.89 cm (3.5 in) by separating the instrument clamping jaws to this length and the sample was centered horizontally between the jaws so that an approximate equal length of sample was held by each jaw. The sample was tested at a crosshead speed of 51 cm/min (20 in/min) until the sample broke or reached the maximum extension of the machine (101.6 cm (40 in)). The tensile strength in pounds (and later converted to kilograms) and elongation distance were recorded. The percent elongation was determined by dividing the elongation distance by the initial gap distance times 100. Eleven replicates were tested, except where noted, and averaged to provide the thickness, Peak Load, Peak Stress, Percent (%) Strain at Peak Stress, Break Load, % Strain at Break, Energy at Break, and Modulus.

Tensile Break Strength and Elongation (at Break) Test (Method II)

A silicone release liner was applied to the non-liner side of the article. A 1.27 cm (0.5 in) wide by about 12.7 cm (5 in)

long sample was cut in the machine direction from the article to be tested to form the test specimen. One liner was removed and a 2.54 cm (1.0 in) length was measured and marked in the center of test specimen to provide the initial gap distance. A 2.54 cm (1 in) wide by about 7.62 cm (3 in) piece of masking tape was placed across the foam article by positioning the tape edge on the both marks so that the 2.54 cm (1 in) long section that was marked off did not have tape covering it. The other liner was then removed and masking tape was wrapped completely around the article, making sure to keep the masking tape aligned across the article. The tape was used to prevent the sample from adhering to the INSTRON jaws and prevent the sample from breaking at the point where it was clamped by the jaws. The INSTRON was set up with the following conditions:

Jaw Gap: 2.54 cm (1.0 in)
Crosshead Speed: 25.4 cm/min (10 in/min)

The test specimen was then positioned in the INSTRON jaws so that the jaws lined up with the edge of the masking tape. The sample was tested at a crosshead speed of 25.4 cm/min (10 in/min) until the sample broke. The tensile break strength or peak load was recorded in pounds (and later converted to kilograms) and elongation distance was recorded. The percent elongation at break was determined by dividing the elongation distance by the initial gap distance times 100. One specimen per sample was tested.

90 Degree Peel Adhesion Test

A 25.4 mm (1 in) or a 12.7 mm (0.5 in) wide by about 127 mm (5 in) long sample was cut from the article to be tested and laminated to an about 15.24 mm (6 in) long by about 28.6 mm (1.125 in) wide by 0.025 mm (0.001 in) thick primed polyester film by rolling down the article onto the primed side of the polyester film, taking care not to trap air bubbles between the film and the article. The 12.7 mm (0.5 in) wide sample was similarly laminated to an about 152.4 mm (6 in) long by about 15.8 mm (0.625 in) wide by 0.025 mm (0.001 in) thick primed polyester film. The laminate was then positioned on either a solvent-washed (one wash of acetone followed by three washes of heptane), dry, 51 mm (2 in) wide by about 127 mm (5 in) long, Type 6061-T6 alloy bare standard aluminum panel or a solvent-washed (three washes of isopropyl alcohol), dry 51 mm (2 in) wide by about 127 mm (5 in) long polypropylene panel, so that the laminate was centered on the panel with a portion of the laminate extending off the panel to serve as a tab. The laminate was rolled down onto the panel using a 2 kg (4.5 lb) hard rubber roller, with one pass in each direction. Care was taken not to trap bubbles between the panel and the laminate. The sample thus prepared was allowed to dwell at room temperature (about 22° C.) for about 24 hours. Then the sample was tested at room temperature (about 22° C.) for 90 Degree Peel Adhesion by Method A (for polypropylene panels) or Method B (for aluminum panels) described below.

Method A: The sample was tested at crosshead speed of 30 cm/min (12 in/min) using an IMASS tester fitted with a 4.5 kg (10 lb) load cell. The peel value obtained from the first 0.51 cm (0.2 in) length of peel was ignored. The peel value of the next 5.08 cm (2 in) or "peel area" was recorded as an integrated average value. The values reported were the average of 3 replicates.

Method B: The sample was tested at crosshead speed of 30 cm/min (12 in/min) using a SINTECH 5/GL Instron tester fitted with a 45 kg (100 lb) load cell. The peel value obtained from the first 1.27 cm (0.5 in) length of peel was ignored. The integrated average peel value of the next 89 mm (3.5 in) or "peel area" was recorded. The values reported were the integrated average peel adhesion values of three replicates.

Stretch Release Test

A 12.5 mm (0.5 in) wide by 127 mm (5 in) long strip was cut from the test sample such that the length was cut in the machine direction of the sample.

One strip was laminated to a 50.8 mm (2 in) wide×127 mm (5 in) long aluminum or glass panel such that the strip was approximately 0.635 cm (0.25 in) from one of the long edges of the panel and approximately 25.4 mm (1.0 in) of the strip extends beyond the end of the panel. Care was taken to ensure maximum wet-out of or contact between the strip and the panel. It was desired that 100% contact be achieved.

Similarly, a strip from a different example was laminated along the other edge of the glass panel.

Then a second like panel (i.e., aluminum to aluminum or glass to glass) was laminated directly over the first panel making sure not to entrap air bubbles between the strips and the second panel. The bonded sample was allowed to dwell for between 24 hours and 72 hours at room temperature (about 22° C.).

The free end of the test strips were pulled by hand at a speed of about 30 cm/min (about 12 in/min) in a direction substantially parallel to the panels to initiate stretch release removal until the bond failed. Only the glass panels were visually examined for the presence of residue and the failure mode was recorded. A sample was rated as "Pass" if there was complete removal from the panel. A sample was rated as "Fail" if the sample could not be completely removed.

Thermal Impedance Measurement

The thermal impedance of single layers of the disclosed invention was measured according to ASTM C-1114 Test Method "Steady-State Thermal Transmission Properties by Means of the Thin-Heater Apparatus."

Figure 5:
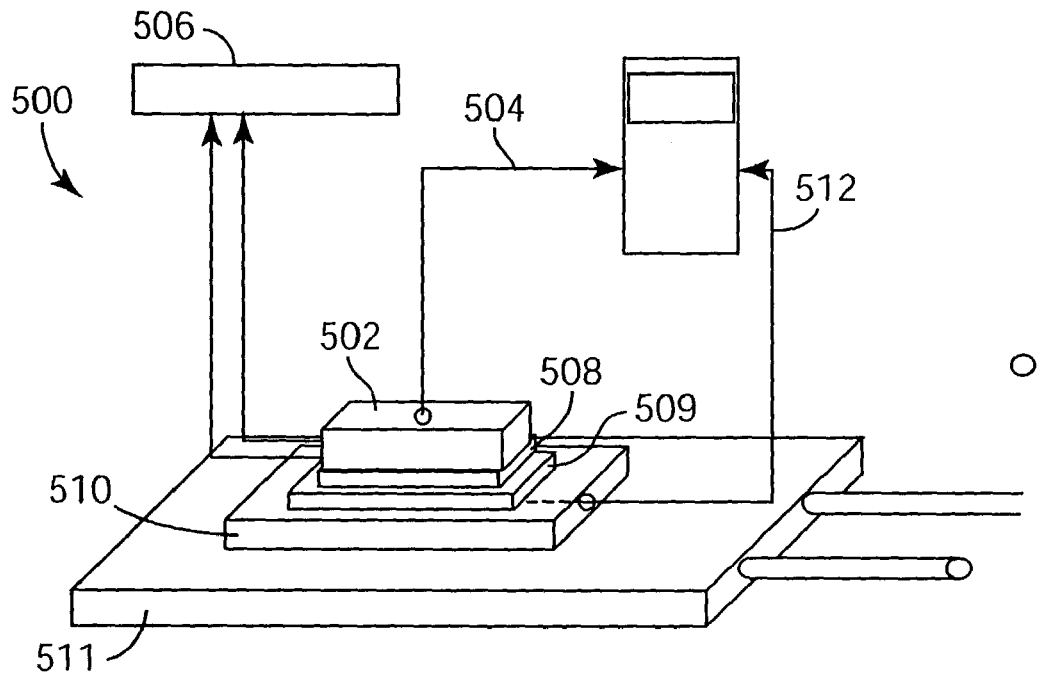
FIG. 5 is a schematic diagram of the thin-heater test apparatus used in the Examples.

A diagram of the Thin-Heater Apparatus 500 is shown in FIG. 5.

A small resistor 502 was used as the thin-heater. The resistor used was a 10 ohm resistor in TO-220 package with an area of 0.806 cm$^2$ (0.125 in$^2$) (such as Caddock Electronics MP930). A small hole was drilled through the back of the resistor into which a thin-wire thermocouple 504 was placed to measure the hot side temperature, $T_h$.

A know amount of power, Q, was supplied from the precision power supply 506 (such as Hewlett Packard E3611A) by setting the current and voltage (Power=current×voltage). The sample to be tested 508 was placed onto a disposable test surface 509 and between the thin-heater and the cold aluminum test block 510, cooled by running cold water through a cooling block 511. The cold test block had a thermocouple 512 for measuring the cold side temperature, $T_c$. The resistor was powered up and the temperature of the resistor was allowed to come to equilibrium. Temperatures $T_h$ and $T_c$ were recorded and the impedance and conductivity calculated according to ASTM C 1114 using the following relationships:

A=area of thin heater
Power, Q=voltage×current supplied
Rate of heat flux, q=Q/A
Delta T=$T_h$-$T_c$
Thermal resistance (R)=Delta T/q
Thermal impedance ($Z_{uncorr.}$)=R×A The thermal impedance was corrected for any heat loss off the top (horizontal) surface of the resistor (but not the sides of the sample) and reported as $Z_{corr.}$.

$Z_{corr.}$=$Z_{uncorr.}$-[convective heat loss value of the resistor×(surface temperature $T_h$ of the resistor-room temperature)]

where the convective heat loss value for TO-220 type resistor=0.011 Watts.

Further discussion can be found in the article "Factors Affecting Convection Heat Transfer", *Heat Transfer*, Watlow Education Series, Book One, 1995, pages 16-17. The convection heat loss value is taken from FIG. 17 on page 17 based upon the size of the test resistor.

Thermal Bulk Conductivity Measurement

An impedance plot method was used to thermal bulk conductivity (k). The samples were obtained by either extruding material at different thicknesses or by combining multiple layers of a single sample to obtain different thicknesses.

The thermal impedance ($Z_{corr.}$) was measured according to the above test method for samples of different thickness. The data was then plotted allowing for a finite value of the interfacial impedance. This plot method can be expressed as an equation:

$$Z_{corr.} = Z_{interface} + t/k$$

Figure 6:
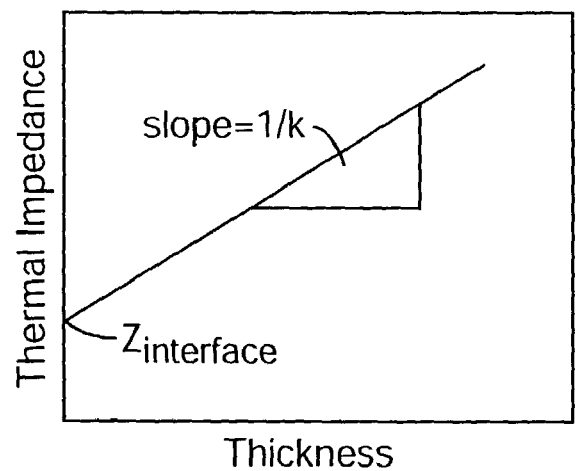
FIG. 6 is a plot of thermal impedance ($Z_{corr}$) versus thickness (t) used to calculate bulk thermal conductivity in the Examples.

As illustrated in FIG. 6, a plot of corrected thermal impedance ($Z_{corr.}$) versus thickness (t) resulted in a line having a slope=1/k and an intercept at t=0 equal to $Z_{interface}$. Thermal bulk conductivity (k) was then calculated from slope of the line.

Materials Used in the Examples

| Component | Trade Name | Description | Source |
|---|---|---|---|
| | | Adhesive | |
| 2-EHA | 2-Ethyl hexyl acrylate | acrylate monomer | BASF Corp., Mount Olive, NJ |
| AA | acrylic acid | acrylate monomer | BASF Corp. |
| IOTG | isooctyl thioglycolate | chain transfer agent | BASF Corp. |
| Kraton D1107 | Kraton ™ D1107 | styrene-isoprene-styrene linear thermoplastic elastomer, nominal molecular weight of 229,000 | Kraton Polymers U.S. LLC, Houston, TX |
| SHELLFLEX 371N | SHELLFLEX ™ 371N | refined petroleum oil | Shell Lubricants, Houston, TX |
| IRGANOX 1010 | IRGANOX ™ 1010 | antioxidant | Ciba Specialty Chemicals Corp, Tarrytown, NY |
| WINGTACK PLUS | Wingtack ™ Plus | tackifying resin, nominal average molecular weight of 1070 | Goodyear Tire & Rubber Co, Chemical Division, Akron, OH |
| IRG 651 | Irgacure ™ 651 | 2,2-dimethoxy-2-phenylacetophenone | Ciba Specialty Chemicals Corp. |
| VA-24 film | VA-24 film | 0.0635 mm thick heat sealable, ethylene vinyl acetate copolymer film having 6% vinyl acetate | CT Film of Dallas, TX |
| | | Filler | |
| BN | boron nitride | thermally conductive particle, hexagonal form; theoretical density of 1.80 | Advanced Ceramics Corporation, Cleveland, OH; now known as GE Advanced Ceramics |
| SiC | silicon carbide (SILICARIDE G-21, Grade p240) | thermally conductive filler; theoretical density of 3.10 | Washington Mills Electro Minerals Corp., Niagara Falls, NY |
| $Al(OH)_3$ | Martinal ON 320 | aluminum hydroxide, particle size 20 microns, theoretical density of 2.40 | Albemarle Corporation, Baton Rouge, LA |
| $Mg(OH)_2$ | magnesium hydroxide | thermally conductive filler; theoretical density 2.40 | Albemarle Corporation |
| F-100D | Micropearl ™ F-100D | expandable polymeric microspheres having a shell composition containing acrylonitrile and methacrylonitrile | Pierce Stevens, Buffalo, NY |
| Exact 3040 | Exact ™ 3040 | ethylene-based hexene copolymer, nominal tensile yield strength (MD) 5.4 MPa (780 psi), tensile break strength (MD) 51.6 MPa (7490 psi), elongation at break (MD) 460%, MI 16.5, density 0.900 g/cm³, peak melting temperature 96° C. (205° F.) | ExxonMobil Chemical Company, Houston, TX |

Examples 1-4

Four acrylic TIMs were prepared using expandable polymeric microspheres (F-100D) and varying amounts of thermally conductive fillers. Each composition was coated at several thicknesses.

Preparation of Pressure Sensitive Adhesive A (PSA-A):

A pressure sensitive adhesive composition was prepared by mixing 95 parts 2-EHA, 5 part AA, 0.15 parts IRG 651, and 0.02 parts IOTG.

The composition was placed into VA-24 film packages measuring approximately 100 mm by 50 mm by 5 mm thick, immersed in a water bath and exposed to UV radiation as described in U.S. Pat. No. 5,804,610. Viscosity of PSA-A was 3980.73 Poise (P) as tested according to test method above. This adhesive is believed to have a weight average molecular weight ($M_w$) of about 700,000 to about 1,200,000. The density of PSA-A was 0.98 g/cc.

Preparation of TIM:

PSA-A was fed to the feed port in barrel section 1 of a 30 mm co-rotating twin screw extruder with four ports (Werner Pfleider) operating at a screw speed set point of 200 rpm (actual speed about 176 rpm) via a 51 mm single screw extruder (Bonnot). The temperature for all zones in the Bonnot extruder was set at 149° C. (300° F.). Thermally conductive fillers as specified in Table 1 (parts by weight as specified in Table 1 per 100 parts by weight of PSA-A plus thermally conductive filler) were added as dry solids in one portion to a feed port in barrel section 5 of the twin screw extruder with a total flow rate of thermally conductive filler and PSA-A of about 3.18 kg/hr (7 lb/hr). F-100D microspheres at a concentration of 0.5 parts by weight per 100 parts by weight of PSA-A were added downstream to barrel section 7. In all six temperature zones in the twin screw extruder, the temperature was set at 93.5° C. (200° F.). A vacuum (in a range from about −77.9+/−10.2 newtons/sq. meter ($N/m^2$)(−23+/−3 inches of mercury (Hg)) was applied through a port in barrel section 9. The temperatures in the extruder adapters and the flexible hose at the exit end of the extruder were all set at 113° C. (235° F.). The flow rate was controlled with a heated Zenith melt pump, nominally 10.3 cc/rev, set at 113° C. (235° F.).

The extrudate was pumped via the heated hose to a (15.24 cm (6 in) wide single layer drop die with a gap of about 0.114 cm (0.045 in). The die temperature was set at 182° C. (360° F.). The line speed was adjusted to provide the target thickness as specified in Table 1.

The extruded sheet was cast into a nip formed by a two chill rolls (one metal and one rubber), between two silicone coated polyester release liners. The temperatures of the chill rolls were set at 7.5° C. (45° F.). Each liner was a 0.051 mm (0.002 in) thick two sided, silicone-coated polyester liner, having different release materials (identified as 5035 and 7200) on each side, available from DCP-LOHJA Inc., Willowbrook, Ill., as 2-2PESTR(P2)-5035 and 7200. The extruded sheet contacted the 7200 side of one liner and the 5035 side of the other liner. The liner having 7200 release material in contact with the extruded sheet was removed and the resulting article was wound into a roll for subsequent crosslinking.

TABLE 1

| Ex. No. | Conductive Filler | Weight Percent Conductive Filler | Target Thickness, cm (mils) | Measured Thickness, cm (mils) |
|---|---|---|---|---|
| 1 | BN | 40 | 0.0508 (20) | 0.0439 (17.3) |
| 2 | BN | 50 | 0.0508 (20) | 0.0538 (21.2) |
| 3 | Al(OH)$_3$ | 40 | 0.0508 (20) | 0.0569 (22.4) |
| 4 | Al(OH)$_3$ | 50 | 0.0508 (20) | 0.0462 (18.2) |

Two approximately 0.46 meter (m) (18 in) long pieces were cut from the above sample roll. 2-2PESTR(P2)-5035 and 7200 release liner was carefully laminated to the uncovered side of each piece with the 7200 silicone coated side contacting the uncovered side. The extruded sheets with liners on both sides were then subjected to gamma radiation as described below.

Samples were passed through a gamma processing unit (Research Loop of Panasonic Industrial Irradiator JS 7500, Cobalt 60 Wet Storage, available from M. D. S. Nordion, Kanota, Ontario, Canada). Each piece received a measured gamma dose between 31.6 to 36.4 kilograys (kGy) (target dose 30 kGy).

The resultant article was then tested for physical properties, the Test Method outlined above. The Thermal Bulk Conductivity for Examples 1-4 was 0.82, 0.95, 0.60, and 0.85 Watts/meter-K respectively.

Results are given in Table 2.

TABLE 2

| Ex. No. | Density, g/cm$^3$ (measured/ theoretical) | % Void Volume | Peel Adhesion, kN/m (oz/in) | | Static Shear, Minutes | | Impedance, ° C.-cm$^2$/W (° C.-in$^2$/W) | |
|---|---|---|---|---|---|---|---|---|
| | | | Al | PP | 22° C. | 70° C. | $Z_{uncorr.}$ | $Z_{corr.}$ |
| 1 | 1.106/1.30 | 14.9 | 0.601 (54.9) | 0.069 (6.3) | 10,000+ | 10,000+ | 8.32 (1.29) | 9.03 (1.40) |
| 2 | 1.206/1.38 | 12.6 | 0.426 (38.9) | 0.0722 (6.6) | 10,000+ | 10,000+ | 7.61 (1.18) | 8.26 (1.28) |
| 3 | 1.081/1.55 | 30.3 | 0.380 (34.7) | 0.118 (10.8) | 10,000+ | 10,000+ | 14.32 (2.22) | 16.71 (2.59) |
| 4 | 1.221/1.69 | 27.8 | 0.420 (38.4) | 0.0996 (9.1) | 10,000+ | 10,000+ | 10.39 (1.61) | 11.48 (1.78) |

Example 5

An acrylic thermal interface composition was prepared using a blend of two thermally conductive fillers that also functioned as the foaming agent.

Preparation of Thermal Interface Composition:

A thermally interface composition was prepared according to Examples 1-4 except that the conductive filler was a dry blend of 82 parts by weight of SiC and 18 parts by weight of BN and no expandable polymeric microspheres were used.

TABLE 3

| Ex. No. | Conductive Filler | Weight Percent Conductive Filler | Target Thickness, cm (mils) | Measured Thickness, cm (mils) |
|---|---|---|---|---|
| 5 | 82:18 SiC:BN | 60 | 0.0508 (20) | 0.0549 (21.6) |

Samples were subjected to gamma radiation as in Examples 1-4.

The TIM was then tested for physical properties according to the Test Methods outlined above. The Thermal Bulk Conductivity of Example 5 was 0.97 Watts/meter-K.

Results are given in Table 4.

TABLE 4

| Ex. No. | Density, g/cm$^3$ (measured/ theoretical) | % Void Volume | Peel Adhesion, kN/m (oz/in) | | Static Shear, Minutes | | Impedance, °C.-cm$^2$/W (°C.-in$^2$/W) | |
|---|---|---|---|---|---|---|---|---|
| | | | Al | PP | 22° C. | 70° C. | $Z_{uncorr.}$ | $Z_{corr.}$ |
| 5 | 1.43/2.11 | 32.2 | 0.730 (66.7) | 0.172 (15.7) | 10,000+ | 10,000+ | 8.06 (1.25) | 8.84 (1.37) |

Example 6

A thermoplastic elastomeric TIM was prepared using the blend of two thermally conductive fillers of Example 5. The silicon carbide also acted as a chemical blowing agent. There was no premixing of a PSA composition. The composition was coated at several thicknesses. The resultant article was not subjected to irradiation.

Preparation of TIM:

100 parts Kraton D1107 were added to the feed port in barrel section 1 of the twin screw extruder of Examples 1-4 at a feed rate of 2.60 kg/hr (5.73 lbs/hr). 179 parts WINGTACK PLUS tackifying resin was melted in a Helicon Mixer (tank set at 149° C. (300° F.), pump and hose set at 163° C. (325° F.)) and pumped to feed port in barrel section 3 at a feed rate of 1.87 kg/hr (4.11 lb/hr). 23 parts SHELLFLEX 371N oil was added through a feed port in barrel section 5 using a Zenith pump at a feed rate of 0.24 kg/hr (0.528 lb/hr). The total flow rate of the adhesive (i.e., Kraton D1107, WINGTACK PLUS tackifying resin, and SHELLFLEX 371N) was about 3.18 kg/hr (7 lb/hr). The density of the adhesive was 0.96 g/cc.

Thermally conductive fillers as specified in Table 5 and 3 parts IRGANOX 1010 were added as a dry blend in one portion to a feed port in barrel section 5 at a flow rate of 2.60 kg/hr (5.73 lb/hr).

The six temperature zones in the twin screw extruder were set as follows: Zone 1 at 149° C. (300° F.), Zone 2 at 154.4° C. (310° F.), and Zones 3 to 6 at 160° C. (320° F.). A vacuum (in a range from about −77.9+/−10.2 N/m$^2$ (−23+/−3 inches of mercury (Hg)) was applied through a port in barrel section 9. The temperature in the extruder adapters and the flexible hose at the exit end of the extruder were set at 160° C. (320° F.). The flow rate was controlled with a heated Zenith melt pump, nominally 10.3 cc/rev, set at 160° C. (320° F.).

The extrudate was pumped via the heated hose to the single layer drop die of Examples 1-4. The temperature of the die was set at 163° C.±14° C. (325° F.±25° F.). The line speed was adjusted to provide the target thickness as specified in Table 5. The extruded sheet was cast into a nip formed by a two chill rolls (one metal and one rubber), between two silicone coated polyester release liners of Examples 1-4. The temperature of the chill rolls was set at 7.5° C. (45° F.). One liner was removed and the resulting article was wound into a roll.

TABLE 5

| Ex. No. | Conductive Filler | Weight Percent Conductive Filler | Target Thickness, cm (mils) | Measured Thickness, cm (mils) |
|---|---|---|---|---|
| 6 | 82:18 SiC:BN | 45 | 0.0508 (20) | 0.0424 (16.7) |

The TIM was then tested for physical properties according to the Test Methods outlined above. Results are given in Table 6. For the density calculation, the density of the thermoplastic elastomeric adhesive without thermally conductive filler was measured as 0.96 g/cc. The Thermal Bulk Conductivity of Example 6 was 0.84 Watts/meter-K.

TABLE 6

| Ex. No. | Density, g/cm$^3$ (measured/ theoretical) | % Void Volume | Peel Adhesion, kN/m (oz/in) | | Static Shear, Minutes | | Impedance, °C.-cm$^2$/W (°C.-in$^2$/W) | |
|---|---|---|---|---|---|---|---|---|
| | | | Al | PP | 22° C. | 70° C. | $Z_{uncorr.}$ | $Z_{corr.}$ |
| 6 | 1.32/1.83 | 27.9 | 1.103 (100.8) | 1.600 (146.2) | 10,000+ | 98.5 | 10.84 (1.68) | 12.39 (1.92) |

Example 7

Preparation of Thermal Interface Composition

Acrylic thermal interface compositions were prepared using various thermally conductive fillers.

Preparation of Pressure Sensitive Adhesive B (PSA-B):

A pressure sensitive adhesive composition (PSA-B) was prepared according to the preparation of PSA-A except that 97 parts 2-EHA, 3 part AA, and 0.01 parts IOTG was used in place of 95 parts 2-EHA, 5 parts AA, and 0.02 parts IOTG. Viscosity of PSA-B was 2215.2 P as tested according to test method above. This adhesive is believed to have a weight average molecular weight ($M_w$) of about 800,000 to about 1,300,000. The density of PSA-B was 0.98 g/cc.

Preparation of TIM:

PSA-B was fed at a feed rate of 4.55 kg/hr (10 lb/hr) via the Bonnet extruder of Examples 1-4 into barrel 1 of a co-rotating twin screw extruder (40 mm Berstorff ZE-40, L/D=40, 10 barrels). All temperature zones of the Bonnot extruder were set at 149° C. (300° F.) except for Zone 1, which was set at 135° C. (275° F.). The thermally conductive fillers were fed as dry solids into barrels 2 and 4 of the twin screw extruder, at feed rates of 2.27 kg/hr (4 lb/hr) and 2.73 kg/hr (6 lb/hr) respectively, using gravimetric feeders (K-Tron model T20, K-Tron, Pitman, N.Y.). Table 7 below provides amount and type of conductive filled added. This split feed arrangement was used to successfully obtain the required loading levels of the low bulk density filler. In addition, the vertical drop distances were kept as short as possible to avoid excess air entrapment. Each extrusion screw was composed of self-wiping and square channel double-flighted conveying elements of varying pitch (60 mm, 40 mm, and 30 mm). The screws also contained 5-paddled kneading blocks, 50 mm in length, offset in three different arrangements: (1) 45 degrees in a forward (LI) direction, (2) 45 degrees in a reverse (RE) direction, or (3) 90 degrees in a neutral pattern. The first 370 millimeters of the screw was composed of forward conveying, self-wiping elements (pitches of 30 and 60). The first kneading section was located between 370-520 mm of the screw and consists of a forward, neutral, and reverse kneading block. A conveying section (520-770 mm) and another kneading segment (770-920 mm) follow. This kneading section was composed of two forward blocks followed by a reverse block. The remainder of the screw (920-1600 mm) is composed of self-wiping and square channel forward conveying elements of various pitches, generally following a declining trend in pitch (60 mm, 40 mm, 30 mm). The twin screw extruder was operated with a screw speed set point of 200 rpm (actual speed about 200 rpm) at a temperature of 125° C. (257° F.) in all zones. A vacuum (about −94.81 kN/m2 (−28 inches of mercury (Hg)) was applied through an open port in Zone 8 to remove any volatiles and/or moisture. As noted in the screw design, large pitch forward conveying elements were used in the vacuum area to provide a lower degree of fill thereby maximizing polymer surface area. The extrudate was pumped via a heated Nornag melt pump, nominally 10.3 cc/rev, set at 125° C. (257° F.) through a 1.905 cm (0.75 in) diameter stainless steel neck tube set at 154.4° C. (310° F.) to the middle/center layer of a 4.17 cm (10 in) wide 3-layer Cloeren drop die, having a 0.102 cm (0.040 in) gap (available from The Cloeren Company, Orange, Tex.). The die temperature was set at 177° C. (350° F.). The line speed was adjusted to provide the target thickness as specified in Table 7.

TABLE 7

| Ex. No. | Conductive Filler | Weight Percent Conductive Filler | Target Thickness, cm (mils) | Measured Thickness, cm (mils) |
|---|---|---|---|---|
| 7a | 82:18 SiC:BN | 50 | 0.0508 (20) | 0.0406 (16) |
| 7b | 82:18 SiC:BN | 50 | 0.0762 (30) | 0.0762 (30) |
| 7c | 82:18 SiC:BN | 50 | 0.1016 (40) | 0.0991 (39) |

The extruded sheet was cast onto the two side, silicone coated, polyester liner of Examples 1-4 in contact with a chilled cast roll. The sheet was cast onto the 5035 side of 2-2PESTR(P2)-5035 and 7200 release liner. The temperature of the cast roll was set at 7.5° C. (54° F.). The resulting article was wound into a roll for subsequent crosslinking.

Eight approximately 0.46 m (18 in) long pieces were cut from the above sample roll. 2-2PESTR(P2)-5035 and 7200 release liner was carefully laminated to the uncovered side of each piece with the 7200 silicone coated side contacting the uncovered side. The extruded sheets with liners on both sides were then subjected to gamma radiation as described below.

Samples were subjected to gamma radiation and were passed through the gamma processing unit of Examples 1-4. Two sample pieces each received a target (actual measured) gamma dose of between about 30 kGy (31.6-31.7 kGy), 45 kGy (44.4-45.9 kGy), or 60 kGy (58.8-59.7 kGy).

The resultant articles were then tested for physical properties, and adhesive performance properties according to the Test Methods outlined above. Results are given in Tables 8 and 9. The test method used was Tensile Break Strength and Elongation Test (Method I).

TABLE 8

| Ex. No. | Density, g/cm³ (measured/theoretical) | Hardness | % Volume Gas Phase | Radiation Type and Amount | Peel Adhesion, kN/m (oz/in) Al | Static Shear, Minutes 22° C. | Static Shear, Minutes 70° C. | Impedance, ° C.-cm²/W (° C.-in²/W) $Z_{uncorr.}$ | Impedance, ° C.-cm²/W (° C.-in²/W) $Z_{corr.}$ | Thermal Bulk Conductivity |
|---|---|---|---|---|---|---|---|---|---|---|
| 7a | 1.347(a)/1.92 | NT | 29.82 | Gamma, 30 kGys | NT | 10,000+ | 10,000+ | NT | NT | 1.12 |
| 7b | 1.461(a)/1.92 | NT | 23.93 | Gamma, 30 kGys | NT | 10,000+ | 10,000+ | NT | NT | |
| 7c | 1.478/1.92 | 24(b) | 23.04 | Gamma, 45 kGys | 0.727 (66.4) | NT | NT | NT | NT | |

(a)Measured on samples that had received 45 kGys dose of Gamma radiation
(b)Measured on 40 mil thick sample that had received 30 kGys dose of gamma radiation

TABLE 9

| Ex. No. | Radiation Type and Amount | Thickness, cm (mils) | Peak Load, kg (lb) | Peak Stress, MPa (psi) | % Strain at Peak Load | Break Load, kg (lb) | Break Stress, MPa (psi) | % Strain at Break | Energy at Break, cm-kg (in-lb) | Modulus, MPa (psi) |
|---|---|---|---|---|---|---|---|---|---|---|
| 7c | Gamma, 45 kGy | 0.0864 (34) | 0.409 (0.9) | 0.738 (107) | 408.9 | 0.409 (0.9) | 0.728 (105.6) | 433.6 | 11.74 (10.17) | 0.344 (49.87) |

Examples 8-9

Acrylic thermal interface compositions having stretch release properties provided by in situ microfiber formation were prepared using varying amounts of Exact 3040. Each composition was coated at several thicknesses.

Preparation of TIM:

PSA-B of Example 7 was fed to the feed port in barrel section 3 of the twin screw extruder of Examples 1-4 operating at a screw speed set point of 225 rpm (actual speed about 201 rpm) via Bonnot extruder of Examples 1-4 at a feed rate of 1.95 kg/hr (4.28 lb/hr). The temperature for all zones in the Bonnot extruder was set at 149° C. (300° F.). Thermally conductive fillers as specified in Table 10 (parts by weight as specified in Table 10 per 100 parts by weight of PSA-B plus thermally conductive filler) were added as dry solids in one portion to a feed port in barrel section 1 of the twin screw extruder of Examples 1-4.

For examples containing 25 weight percent of Exact 3040, the feed rates of thermally conductive filler and Exact 3040 were 2.12 kg/hr (4.67 lb/hr) and 0.65 kg/hr (1.43 lb/hr), respectively. For examples containing 30 percent by weight of Exact 3040, the flow rates of thermally conductive filler and Exact 3040 were 2.27 kg/hr (5.00 lb/hr) and 0.83 kg/hr (1.83 lb/hr), respectively. F-100D microspheres, at a concentration of 0.93 parts by weight per 100 parts by weight of PSA-B, were added downstream to barrel section 7 at a feed rate of 0.3 g/min.

In all six temperature zones in the twin screw extruder, the temperature was set at 149° C. (300° F.) except for Zone 4 which was set at 93.5° C. (200° F.). A vacuum (in a range from about −77.9+/−10.2 N/cm$^2$ (−23+/−3 inches of mercury (Hg)) was applied through a port in barrel section 10. The temperatures in the three extruder adapters were 149° C. (300° F.) and the flexible hose at the exit end of the extruder were all set at 165.5° C. (330° F.). The flow rate was controlled with a heated Zenith melt pump, nominally 10.3 cc/rev, set at 149° C. (300° F.).

The extrudate was pumped via the heated hose to the single layer drop die of Examples 1-4. The die temperature was set at 182° C. (360° F.). The line speed was adjusted to provide the target thickness as specified in Table 10.

The extruded sheet was cast into a nip formed by a two chill rolls (one metal and one rubber), between two silicone coated polyester release liners as in Examples 1-4. The temperature of the chill rolls was set at 7.5° C. (45° F.). One liner was removed as in Examples 1-4 and the resulting article was wound into a roll for subsequent crosslinking.

TABLE 10

| Ex. No. | Conductive Filler | Wt. % Conductive Filler | Wt. % Exact 3040 | Wt. % F-100D | Target Thickness, cm (mils) | Measured Thickness, cm (mils) |
|---|---|---|---|---|---|---|
| 8 | 95/5 Mg(OH)$_2$/Al(OH)$_3$ | 45 | 25 | 0.93 | 0.1016 (40) | 0.0724 (28.50) |
| 9 | 95/5 Mg(OH)$_2$/Al(OH)$_3$ | 45 | 30 | 0.93 | 0.1016 (40) | 0.0965 (38.0) |

The resultant roll was subjected to gamma radiation at a measured gamma dose between 33.4 to 35.3 kGy (target was 30 kGy).

Samples were cut from the irradiated roll and tested for physical properties, and adhesive performance properties according to the Test Methods outlined above with the exception for D$_{theor.}$ for which the contribution of expandable microspheres was assumed to be negligible and was not included in the calculation. Results are given in Tables 11 and 12. The test method used was Tensile Break Strength and Elongation Test (Method II).

TABLE 11

| Ex. No. | Density, g/cm³ (measured/ theoretical) | % Void Volume | Hardness | Peel Adhesion, kN/m (lb/0.5 in) Al | Static Shear, Minutes 22° C. | Static Shear, Minutes 70° C. | Impedance, ° C.-cm²/W (° C.-in²/W) $Z_{uncorr.}$ | Impedance, ° C.-cm²/W (° C.-in²/W) $Z_{corr.}$ |
|---|---|---|---|---|---|---|---|---|
| 8 | 1.314/1.608 | 18.3 | 56.0 | NT | 10,000+ | 10,000+ | 14.90 (2.31) | 18.13 (2.81) |
| 9 | 1.263/1.606 | 21.4 | 56.5 | NT | 10,000+ | 10,000+ | 17.29 (2.68) | 22.06 (3.42) |

(a) VLR = very light residue
LR = light residue
SB = sample broke, but was still removable
P = Pass

TABLE 12

| Ex. No. | Thickness, cm (mils) | Peak Load, kg (lb) | % Elongation at Break |
|---|---|---|---|
| 8 | 15.7 (40) | 5.45 (12.0) | 570 |
| 9 | 16.5 (42) | 7.05 (15.5) | 1000 |

While the various features of the preferred embodiment of the invention have been described in detail, changes to these features and to the described embodiment may be apparent to those skilled in the art. Such changes or modifications are believed to be within the scope and spirit of the invention, as set forth in the following claims.

What is claimed is:

1. A foam thermal interface material comprising a foamed pressure sensitive adhesive film, the foamed pressure sensitive adhesive film comprising a blend of an acrylic polymeric hot melt PSA matrix having a number average molecular weight of greater than 25,000 and a viscosity from 2215 to 3981 Poise, and at least 40 percent by weight of thermally conductive filler comprising boron nitride and/or silicone carbide, said foamed film having a void volume greater than about 12 percent of the volume of said foamed film.

2. The foam thermal interface material of claim 1 wherein the foamed film further comprises a fire retardant and/or substantially continuous microfibers.

3. The foam thermal interface material of claim 2 wherein the material has stretch release properties.

4. The foam thermal interface material of claim 3 wherein the microfibers imparting stretch release properties have been formed in situ.

5. The foam thermal interface material of claim 3 having a Shore A hardness of less than about 60.

6. The foam thermal interface material of claim 2 wherein the material will pass UL 94 V-2 rating.

7. The foam thermal interface material of claim 1 wherein the void volume ranges from about 15 to about 75 volume percent of the material.

8. The foam thermal interface material of claim 1 wherein the thermally conductive filler further comprises ceramics, metal oxides, metal hydroxides, or combinations thereof.

9. The foam thermal interface material of claim 1 wherein the thermally conductive filler further comprises silicon nitride, aluminum nitride, titanium nitride, aluminum oxide, beryllia, zirconia, boron carbide, magnesium hydroxide, magnesium oxide, aluminum hydroxide, or combinations thereof.

10. The foam thermal interface material of claim 1 wherein the thermally conductive filler is present in the foamed film in an amount of at least 60 weight percent.

11. The foam thermal interface material of claim 1 further having a backing adjacent to said foamed film.

12. The foam thermal interface material of claim 11 wherein the backing is thermally conductive.

13. The foam thermal interface material of claim 1 further having at least one adhesive skin layer attached to at least a portion of said foamed film.

14. The foam thermal interface material of claim 13 wherein the at least one adhesive skin layer contains thermally conductive filler.

15. The foam thermal interface material of claim 14 wherein the thermally conductive filler is present in the foamed film in an amount greater than the amount of thermally conductive filler in the adhesive skin layer.

16. The foam thermal interface material of claim 1 having a bulk conductivity of at least about 0.5 Watts/meter-K.

17. The foam thermal interface material of claim 1 having a bulk thermal conductivity of at least about 0.6 Watts/meter-K.

18. The foam thermal interface material of claim 1 having a bulk conductivity of at least about 0.8 Watts/meter-K.

* * * * *